US010903385B2

(12) United States Patent
Miyamoto et al.

(10) Patent No.: US 10,903,385 B2
(45) Date of Patent: Jan. 26, 2021

(54) IMAGE SENSOR AND ELECTRONIC DEVICE HAVING THE SAME FOR OUTPUTTING A COUNT VALUE AS A PIXEL VALUE BY COUNTING PULSES PRESENT IN THE OUTPUT SIGNALS FROM PHOTOELECTRIC CONVERTERS

(71) Applicant: CANON KABUSHIKI KAISHA, Tokyo (JP)

(72) Inventors: Yoshiaki Miyamoto, Tama (JP);
Nobuhiro Takeda, Yokohama (JP);
Masanori Tanaka, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 176 days.

(21) Appl. No.: 16/353,017

(22) Filed: Mar. 14, 2019

(65) Prior Publication Data

US 2019/0288150 A1 Sep. 19, 2019

(30) Foreign Application Priority Data

Mar. 15, 2018 (JP) ................. 2018-048395

(51) Int. Cl.
*H01L 31/107* (2006.01)
*H01L 31/02* (2006.01)
*H01L 27/146* (2006.01)
*H04N 5/00* (2011.01)

(52) U.S. Cl.
CPC ...... *H01L 31/107* (2013.01); *H01L 27/14627* (2013.01); *H01L 27/14643* (2013.01); *H01L 31/02027* (2013.01); *H04N 5/00* (2013.01)

(58) Field of Classification Search
CPC ......... H01L 27/14627; H01L 27/14643; H01L 31/02027; H01L 31/107; H04N 5/335; H04N 5/37455
USPC .......................................... 250/208.1, 214 R
See application file for complete search history.

(56) References Cited

U.S. PATENT DOCUMENTS 9,294,701 B2 * 3/2016 Sonoda ................. H04N 5/378

FOREIGN PATENT DOCUMENTS

JP 2012-060012 A 3/2012

* cited by examiner

*Primary Examiner* — Que Tan Le
(74) *Attorney, Agent, or Firm* — Cowan, Liebowitz & Latman, P.C.

(57) ABSTRACT

An image sensor with a simple configuration that generates an image to which a filter has been applied is disclosed. An image sensor comprises a plurality of pixels, each pixel including a photoelectric converter that detects incidence of single photons; and a counter that counts pulses present in an output signal from the photoelectric converter. The image sensor outputs a count value as a pixel value, wherein the count value is obtained by counting the pulses present in the output signals from a plurality of the photoelectric converters in a first period, or by counting the pulses present in the output signal from a single photoelectric converter in the first period and a second period.

22 Claims, 17 Drawing Sheets

IMAGE SENSOR AND ELECTRONIC DEVICE HAVING THE SAME FOR OUTPUTTING A COUNT VALUE AS A PIXEL VALUE BY COUNTING PULSES PRESENT IN THE OUTPUT SIGNALS FROM PHOTOELECTRIC CONVERTERS

BACKGROUND OF THE INVENTION

Field of the Invention

The present invention relates to an image sensor and an electronic device having the same.

Description of the Related Art

Avalanche photodiodes (APD) have a characteristic in that avalanche amplification occurs when the APD is operated with a reverse voltage greater than or equal to the breakdown voltage applied thereto (Geiger-mode). A light-sensitive element that can detect single photons by using this property to operate an APD in Geiger-mode is called a single photon avalanche diode (SPAD).

Japanese Patent Laid-Open No. 2012-60012 discloses a system that uses a photodetector, in which a plurality of SPADs are arranged two-dimensionally, to measures a distance on the basis of the time of flight (TOF) of light. Japanese Patent Laid-Open No. 2012-60012 discloses a configuration in which the photon detection accuracy is increased through simple addition of pulse signals output from the plurality of SPADs.

In a typical digital camera, a filter for noise reduction, edge detection, or the like is applied to captured images using an operational circuit that is separate from the image sensor. It is necessary to apply similar filters to captured images even when using an image sensor in which SPADs are arranged two-dimensionally. However, with the configuration described in Japanese Patent Laid-Open No. 2012-60012, a filter that weights individual pulse signals cannot be applied. If a filter is to be applied to a pulse signal obtained through addition, it is necessary to provide an operational circuit for applying the filter.

SUMMARY OF THE INVENTION

According to the present invention, an image sensor capable of generating an image to which a filter has been applied can be provided with a simple configuration.

According to an aspect of the present invention, there is provided an image sensor comprising: a plurality of pixels, each pixel including a photoelectric converter that detects incidence of single photons; and a counter that counts pulses present in an output signal from the photoelectric converter, wherein the image sensor outputs a count value as a pixel value, and wherein the count value is obtained by counting the pulses present in the output signals from a plurality of the photoelectric converters in a first period, or by counting the pulses present in the output signal from a single photoelectric converter in the first period and a second period.

According to another aspect of the present invention, there is provided an electronic device that comprises an image sensor, wherein the image sensor comprising: a plurality of pixels, each pixel including a photoelectric converter that detects incidence of single photons; and a counter that counts pulses present in an output signal from the photoelectric converter, wherein the image sensor outputs a count value as a pixel value, and wherein the count value is obtained by counting the pulses present in the output signals from a plurality of the photoelectric converters in a first period, or by counting the pulses present in the output signal from a single photoelectric converter in the first period and a second period.

Further features of the present invention will become apparent from the following description of exemplary embodiments with reference to the attached drawings.

DESCRIPTION OF THE EMBODIMENTS

Figure 1:
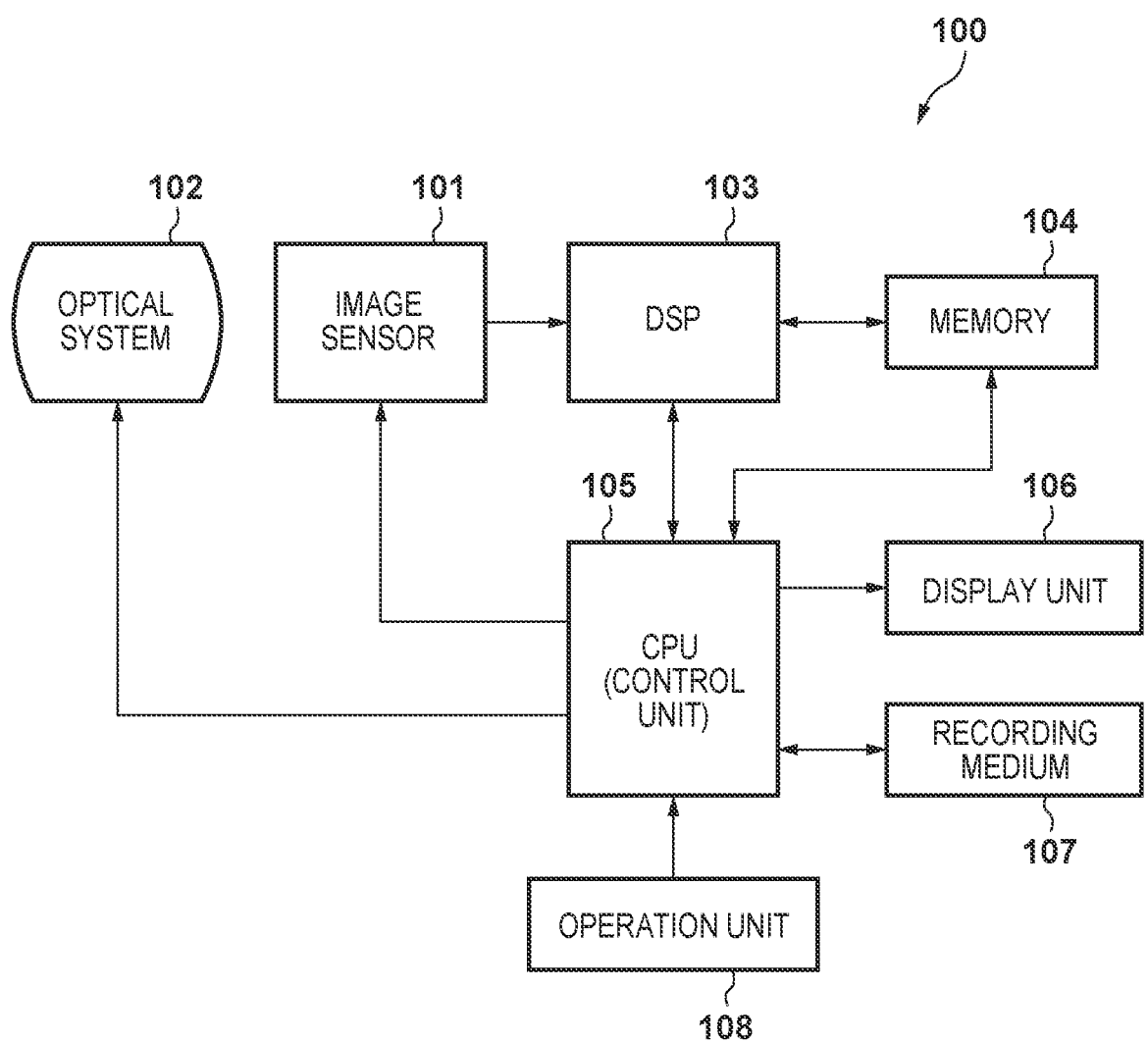
FIG. 1 is a block diagram illustrating an example of an image capturing apparatus according to embodiments of the present invention.

Exemplary embodiments of the present invention will now be described in detail in accordance with the accompanying drawings. In the drawings, like elements are given like reference signs, and descriptions thereof may be omitted. Although the following describes embodiments in which the present invention is applied in a digital camera, which is an example of an electronic device including an image sensor, the present invention can be applied in any electronic device that can include an image sensor. A personal computer, a tablet terminal, a mobile phone, a game console, a drive recorder, a robot, a drone, and the like can be given as examples of such an electronic device aside from an image capturing apparatus. The electronic device is not limited to these examples, however.

First Embodiment

FIG. 1 is a block diagram illustrating an example of the functional configuration of a digital camera 100, serving as an example of an image capturing apparatus, according to embodiments of the present invention. The digital camera 100 comprises an image sensor 101, an optical system 102, a digital signal processor (DSP) 103, a memory 104, a CPU 105, a display unit 106, a recording medium 107, and an operation unit 108.

The optical system 102 includes a lens group and an aperture stop, and forms an optical image of an object on an image plane of the image sensor 101. The optical system 102 includes a mechanism for driving a movable lens, the aperture stop, and the like (e.g., a motor or an actuator). The aperture stop may function as a mechanical shutter.

The image sensor 101 includes a plurality of pixels, each having a photoelectric converter capable of detecting the incidence of single photons, and can convert an optical image formed by the optical system 102 into the number of photons incident on the individual photoelectric converters (digital values).

The DSP 103 is a processor that functions as an image processing circuit applying various types of processing to image data output by the image sensor 101. The CPU 105, which functions as a main control unit, controls the operations of the various units of the digital camera 100. Note that the DSP 103 and the CPU 105 implement predetermined operations by, for example, loading programs, which are stored in non-volatile memory included in the memory 104, into volatile memory (work memory) included in the memory 104 and executing those programs. Additionally, although the CPU 105 can also implement the same type of processing as the DSP 103, the DSP 103 can execute specific signal processing faster than the CPU 105.

The display unit 106 is a display device such as a liquid crystal display (LCD), for example, and displays images that have been shot, various types of information of the digital camera 100 (shooting conditions, various types of setting values, remaining battery power, remaining number of images/time that can be recorded, and so on), a GUI such as a menu screen, and the like.

The recording medium 107 can be read and written to by the CPU 105, and is used as a recording destination for image data obtained through shooting. The recording medium 107 may be a removable memory card, for example.

The operation unit 108 is the collective name for a plurality of input devices of the digital camera 100, such as switches, buttons, dials, a touch panel, and so on. User operations made in the operation unit 108 can be detected by the CPU 105. The operation unit 108 also includes a power switch, a shutter button, a menu button, a directional key, an OK button, and the like, for example. If the operation unit 108 includes a touch panel, an input device having specific functions is normally realized as a combination of the display in the display unit 106 and the touch panel.

Note that the DSP 103 can generate evaluation values from image data, which are used in automatic exposure control (AE), automatic focus detection (AF), and so on, for example. On the basis of these evaluation values, the CPU 105 can determine shooting conditions (aperture value, shutter speed, shooting sensitivity), drive a focus lens included in the optical system 102, carry out AE or AF, and the like. Functions typically provided in a digital camera, such as white balance adjustment, gamma correction, encoding and decoding, and object detection, can, unless otherwise specified, be realized by at least one of the DSP 103 and the CPU 105 executing programs.

Figure 2:
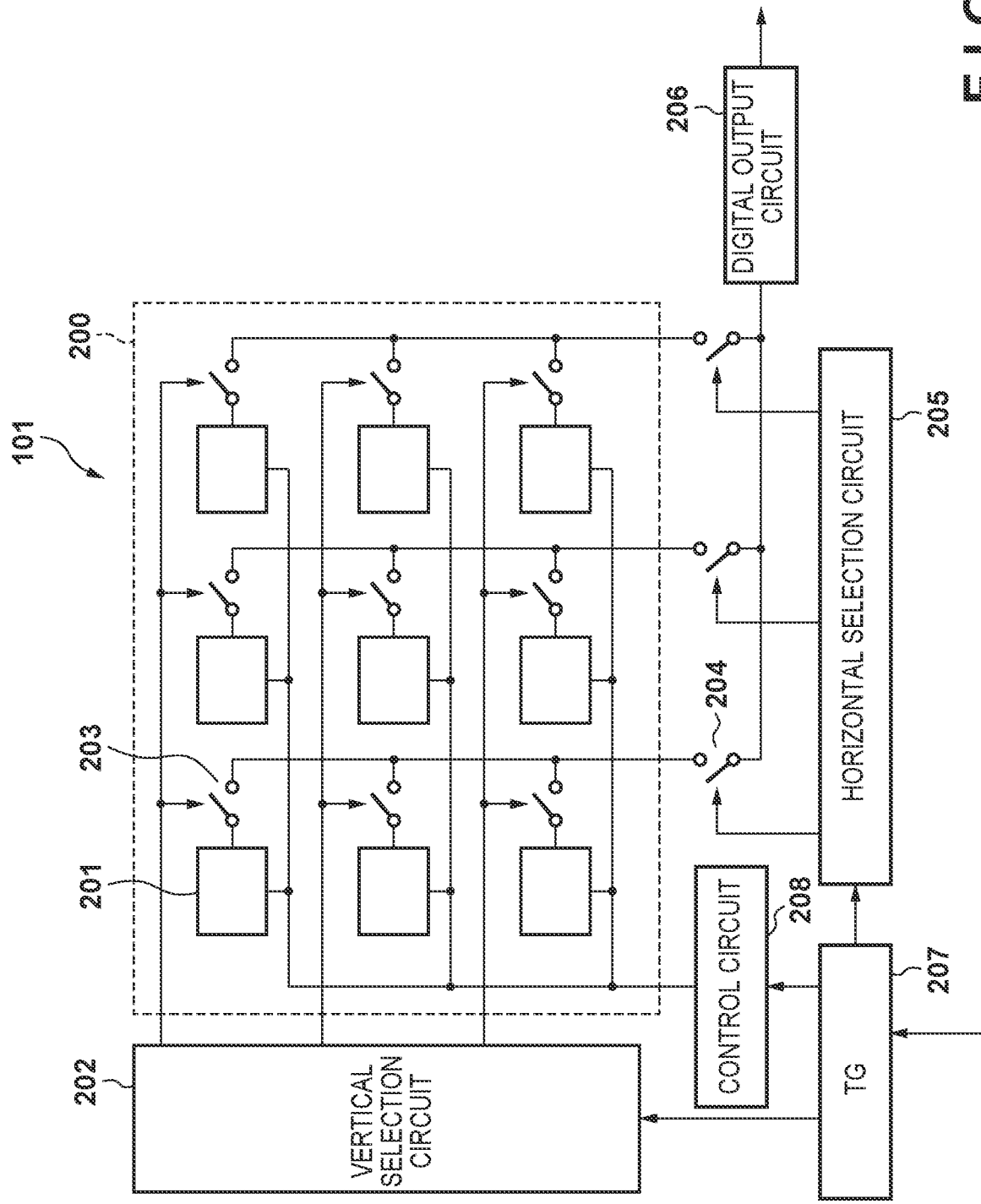
FIG. 2 is a block diagram illustrating an example of the configuration of an image sensor according to embodiments of the present invention.

FIG. 2 is a diagram schematically illustrating an example of the configuration of the image sensor 101. The image sensor 101 includes a pixel array 200, a vertical selection circuit 202, switches 203 and 204, a horizontal selection circuit 205, a digital output circuit 206, a timing generation circuit (TG) 207, and a control circuit 208.

The pixel array 200 includes a plurality of pixels 201 arranged in a two-dimensional shape. Although FIG. 2 only schematically illustrates three rows by three columns of pixels 201, several hundred thousand to several tens of millions of pixels 201 are actually provided. The vertical selection circuit 202 controls whether the switches 203 provided in the corresponding pixels 201 are on or off on a pixel row-by-pixel row basis. Turning a switch 203 corresponding to a pixel 201 on is referred to as "selecting" that pixel 201.

The horizontal selection circuit 205 controls whether the switches 204, which are connected to corresponding vertical signal lines provided for each column of the pixels 201, are on or off. A signal can be read out from one pixel 201 that, of the plurality of pixels 201 included in a row in which the switches 203 are on, is connected to the vertical signal line in which the switch 204 is on. The read-out signal is A/D converted by the digital output circuit 206 and output to the exterior of the image sensor 101 as pixel data.

The control circuit 208 supplies control signals to the pixels 201.

Under the control of the CPU 105, the TG 207 supplies control signals to the vertical selection circuit 202, the horizontal selection circuit 205, and the control circuit 208, and controls the operations of the pixels 201 as well as operations for reading out signals from the pixels 201.

The following will describe the control of operations of a single pixel 201, among the pixels 201 arranged two-dimensionally, that is disposed in an nth row (where n is an integer of 1 or more) (this pixel will be indicated as a pixel 201$n$). The constituent elements constituting the pixel 201$n$ and signals pertaining to the pixel 201$n$ also have "n" appended thereto.

Figure 3:
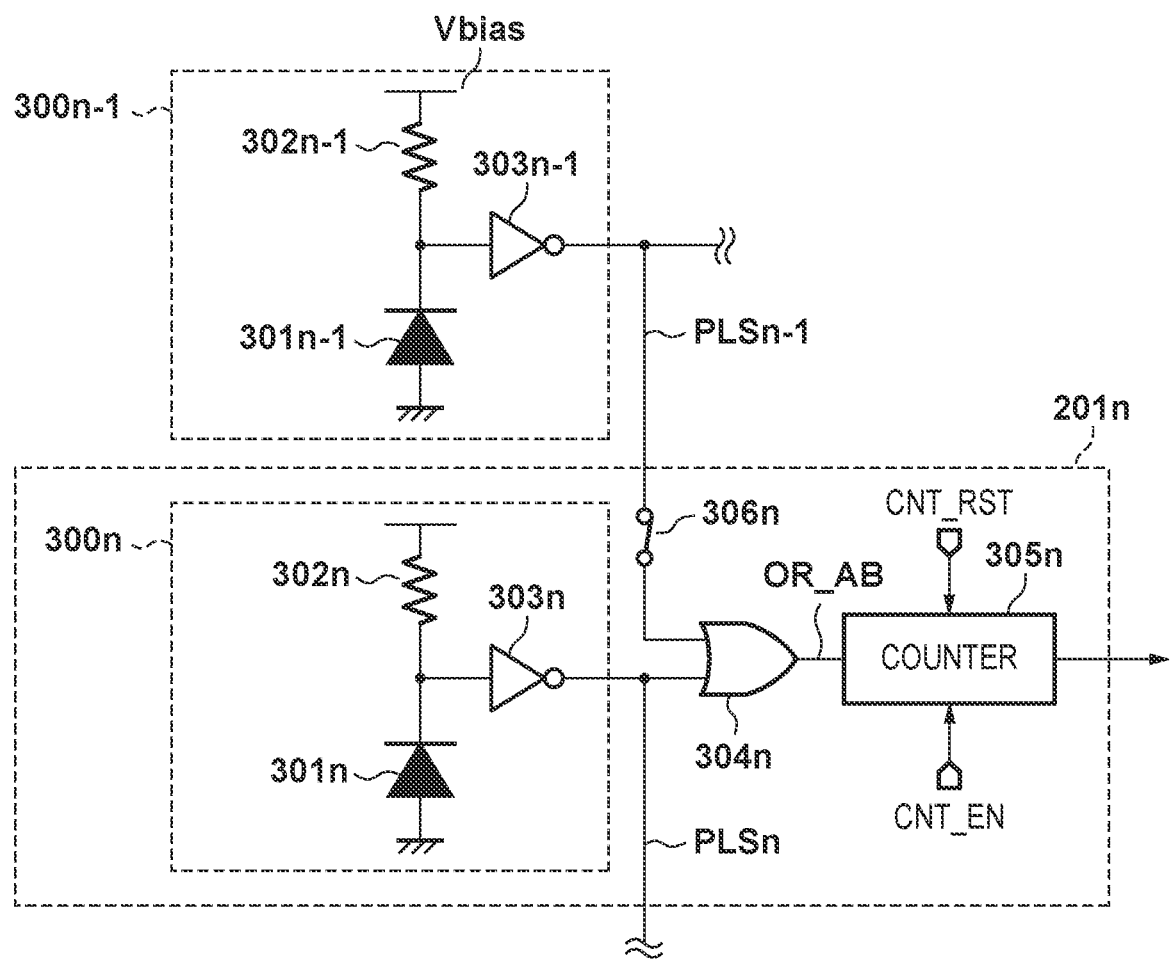
FIG. 3 is an equivalent circuit diagram illustrating a pixel according to a first embodiment.

FIG. 3 is an equivalent circuit diagram illustrating the pixel 201$n$. The pixel 201$n$ includes a light-receiving circuit 300$n$, which is a photoelectric converter, an OR circuit 304$n$, a counter circuit 305$n$, and a switch 306$n$. Note that for the sake of convenience, FIG. 3 also illustrates a light-receiving circuit 300$n$−1, among the constituent elements of a pixel 201$n$−1 located in the n−1th row and having the same configuration as the pixel 201$n$.

The light-receiving circuit 300$n$ includes a photodiode 301$n$, which is a photoelectric conversion element, a quenching resistor 302$n$, and an inverting buffer 303$n$. In the present embodiment, the photodiode 301$n$ is an avalanche photodiode (APD). A bias voltage Vbias, which is greater than or equal to a breakdown voltage, is applied to the photodiode 301$n$ via the quenching resistor 302$n$, and as such, the photodiode 301$n$ operates in Geiger-mode. When a photon is incident on the photodiode 301$n$, a large photoelectric current flows due to avalanche amplification, and a voltage drop occurs at the quenching resistor 302$n$. The bias voltage Vbias applied to the photodiode 301$n$ drops in response, and once the bias voltage Vbias has dropped as far as the breakdown voltage, the avalanche amplification stops. As a result, the photoelectric current ceases flowing, and the bias voltage Vbias is once again applied to the photodiode 301$n$. Note that the quenching resistor 302$n$ is a resistance element for stopping the avalanche amplification of the photodiode 301n. Here, a transistor resistance component may be used as the quenching resistor 302n.

The inverting buffer 303n outputs the voltage change arising in the quenching resistor 302n as a pulse signal. Thus a single pulse signal can be output from the inverting buffer 303n when a photon is incident on the photodiode 301n. Here, a pulse signal output from the light-receiving circuit 300n is indicated by "PLSn", and a pulse signal output from the light-receiving circuit 300n–1 is indicated by "PLSn–1".

The pulse signals output from the light-receiving circuits 300n and 300n–1 are input to the OR circuit 304n. The OR circuit 304n outputs a logical addition signal of the two input signals. The logical addition signal is input to the counter circuit 305n.

The counter circuit 305n counts the number of pulses in the logical addition signal output from the OR circuit 304n. The value counted by the counter circuit 305n ("count value" hereinafter) is supplied to the digital output circuit 206n via the vertical signal line and the switch 204. The switch 306n provided between the light-receiving circuit 300n–1 and the OR circuit 304n is controlled on and off by control signals from the control circuit 208. In other words, the switch 306n can be controlled from outside the image sensor 101. When the switch 306n is off, the pulse signal output from the light-receiving circuit 300n–1 is not input to the OR circuit 304n.

The manner in which the pulse signals PLSn and PLSn–1 output from the two light-receiving circuits 300n and 300n–1 are input to the counter circuit 305n will be described next. First, the control circuit 208 turns the switch 306n on. As a result, the pulse signals PLSn and PLSn–1 output from the two light-receiving circuits 300n and 300n–1 are input to the OR circuit 304n.

The pulse signal output by the light-receiving circuit 300 in each pixel 201 is output to the OR circuit 304 in that pixel, and to (the switch 306 between that OR circuit 304 and) the OR circuit 304 in the pixel one row below in the same column.

The OR circuit 304n generates a logical addition signal from the two pulse signals PLSn and PLSn–1 that have been input, and outputs the generated signal to the counter circuit 305n. The counter circuit 305n then counts the number of pulses in the logical addition signal.

Thus in the present embodiment, the one counter circuit 305n counts the number of pulses in the logical addition signal of the pulse signals PLSn and PLSn–1 output from the two light-receiving circuits 300n and 300n–1. As such, the count value of the counter circuit 305n corresponds to a pixel value to which a filter has been applied in a spatial direction, and more specifically, to a pixel value to which a low-pass filter has been applied in a column direction (the vertical direction). Although a configuration that obtains the logical addition of the output from two adjacent pixels has been described here, the same kind of configuration may be used for three or more adjacent pixels. The low-pass filter effect grows stronger as the number of outputs (pulse signals) for which the logical addition is obtained increases.

Figure 4:
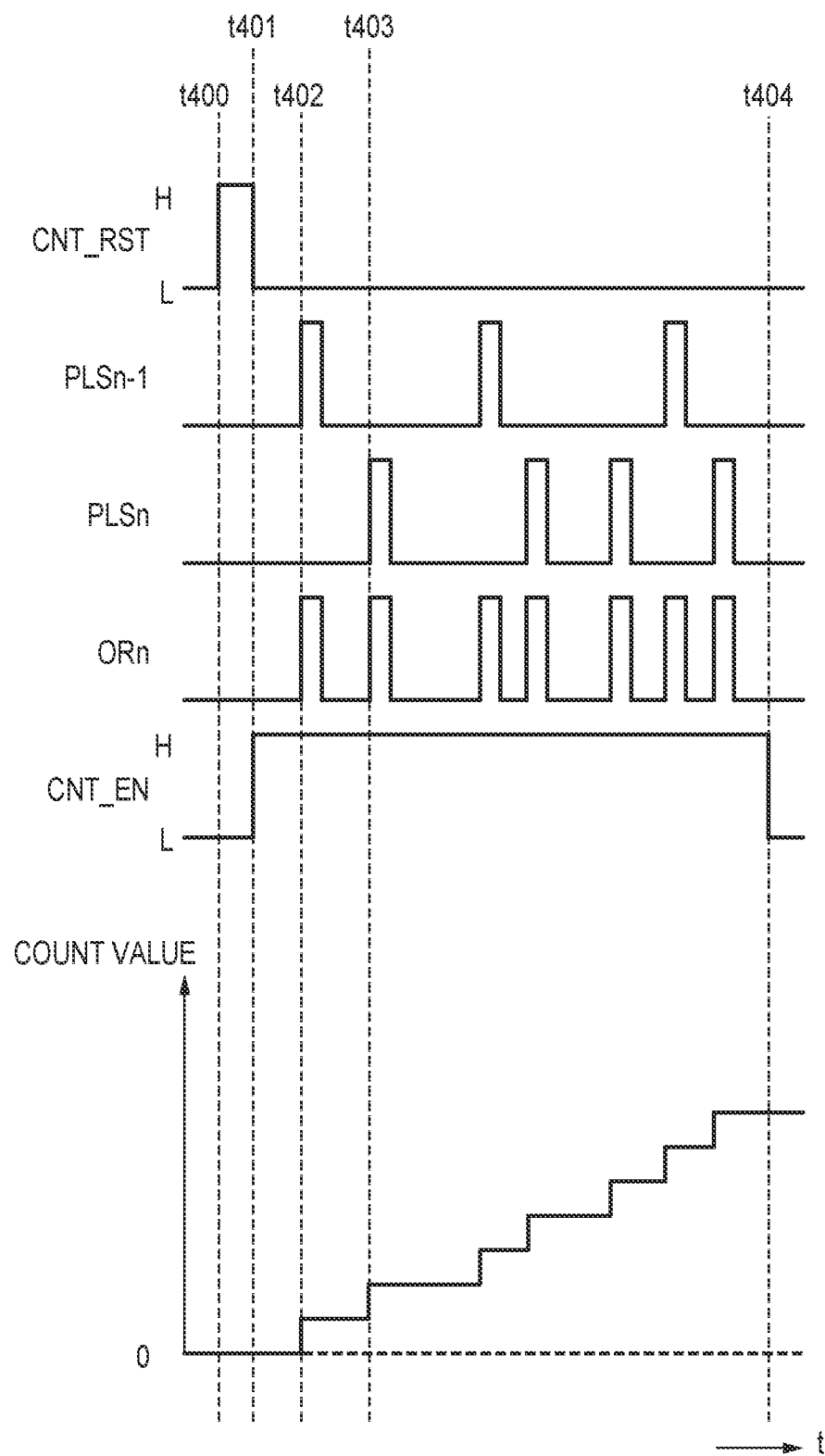
FIG. 4 is a timing chart illustrating an example of a photon counting operation according to the first embodiment.

Operations for counting photons in the pixel 201n illustrated in FIG. 3 will be described next. FIG. 4 is a timing chart illustrating an example of operations for counting photons in the pixel 201n illustrated in FIG. 3. For descriptive purposes, the logical addition signal output by the OR circuit 304n in FIG. 3 is indicated by "ORn". "CNT_RST" and "CNT_EN" indicate control signals for the counter circuit 305n, supplied from the control circuit 208. The count value of the counter circuit 305n is reset when CNT_RST goes to H level. The counter circuit 305n counts the pulses in the logical addition signal only for the period when CNT_EN is at H level. In other words, CNT_EN is a signal that controls the exposure time.

At time t400, CNT_RST goes from L level to H level, and the count value of the counter circuit 305n is reset. Then, at time t401, CNT_RST goes from H level to L level.

Also at time t401, the bias voltage Vbias is supplied to the light-receiving circuits 300n and 300n–1, and a bias voltage greater than or equal to the breakdown voltage is applied to the photodiodes 301n and 301n–1. In response, the photodiodes 301n and 301n–1 operate in Geiger-mode, and produce pulses in the output signals PLSn and PLSn–1 each time a photon is incident. At time t401, CNT_EN goes to H level and the counter circuit 305n starts the count operations.

At time t402, a rectangular pulse is produced in the output signal PLSn–1 from the light-receiving circuit 300n–1 in response to a photon being incident on the photodiode 301n–1 of the light-receiving circuit 300n–1. As a result, the OR circuit 304n outputs a pulse originating from the output signal PLSn–1. The counter circuit 305n counts this pulse, and the count value changes from 0 to 1.

At time t403, a rectangular pulse is produced in the output signal PLSn from the light-receiving circuit 300n in response to a photon being incident on the photodiode 301n of the light-receiving circuit 300n. As a result, the OR circuit 304n outputs a pulse originating from the output signal PLSn. The counter circuit 305n counts this pulse, and the count value changes from 1 to 2.

From time t403 until CNT_EN goes to L level at time t404 and shooting ends, pulses are produced in the output signals PLSn and PLSn–1 each time a photon is incident on the light-receiving circuits 300n and 300n–1. The individual pulse signals are supplied to the counter circuit 305n through the OR circuit 304n, and the number of pulses is counted.

After shooting ends at time t404, the count value of the counter circuit 305n is output to the digital output circuit 206 under the control of the vertical selection circuit 202 and the horizontal selection circuit 205, and is furthermore output to the exterior of the image sensor 101.

As described thus far, the image capturing apparatus of the present embodiment is configured so that an image sensor, in which a plurality of pixels (light-receiving circuits) that can detect single photons are arranged, can output the logical addition of the outputs of a plurality of pixels. Using the logical addition of the output of a plurality of pixels as the output of a single pixel makes it possible to obtain a pixel output to which a low-pass filter has been applied, with a simple configuration. This makes it possible to obtain an image with reduced noise, while at the same time suppressing an increase in the scale of the circuit.

If a low-pass filter is not to be applied, it is sufficient to input only one signal to the logical addition circuit. Specifically, by turning the switch 306 off from outside the image sensor 101 through the control circuit 208, the counter circuit 305 counts the pulse output by a single light-receiving circuit 300. In this manner, whether or not to apply a low-pass filter to a shot image can be controlled dynamically from outside the image sensor. For example, the CPU 105 can control the switches 306 on and off through the control circuit 208 so that a low-pass filter is applied when the shooting sensitivity exceeds a predetermined threshold. Note that if the logical addition of three or more inputs can be output by the logical addition circuit, the number of signals input to the logical addition circuit may be increased stage by stage as the shooting sensitivity increases, in order to strengthen the low-pass filter effect. The shooting sensitivity may be determined through an AE process, or may be a user-set value.

Second Embodiment

Next, a second embodiment of the present invention will be described. The first embodiment describes a configuration in which a low-pass filter effect is achieved by finding the logical addition of the output of a plurality of pixels. In the present embodiment, a high-pass (differential) filter effect is achieved using a configuration in which one of the outputs of two pixels is supplied to a count-up input of an up-and-down counter circuit and the other output is supplied to the count-down input of the up-and-down counter circuit.

Aside from the configuration of the pixel array 200 in the image sensor 101, the present embodiment may be the same as the first embodiment. As such, the following will describe the configuration and operations of the pixel array 200 according to the present embodiment.

Figure 5:
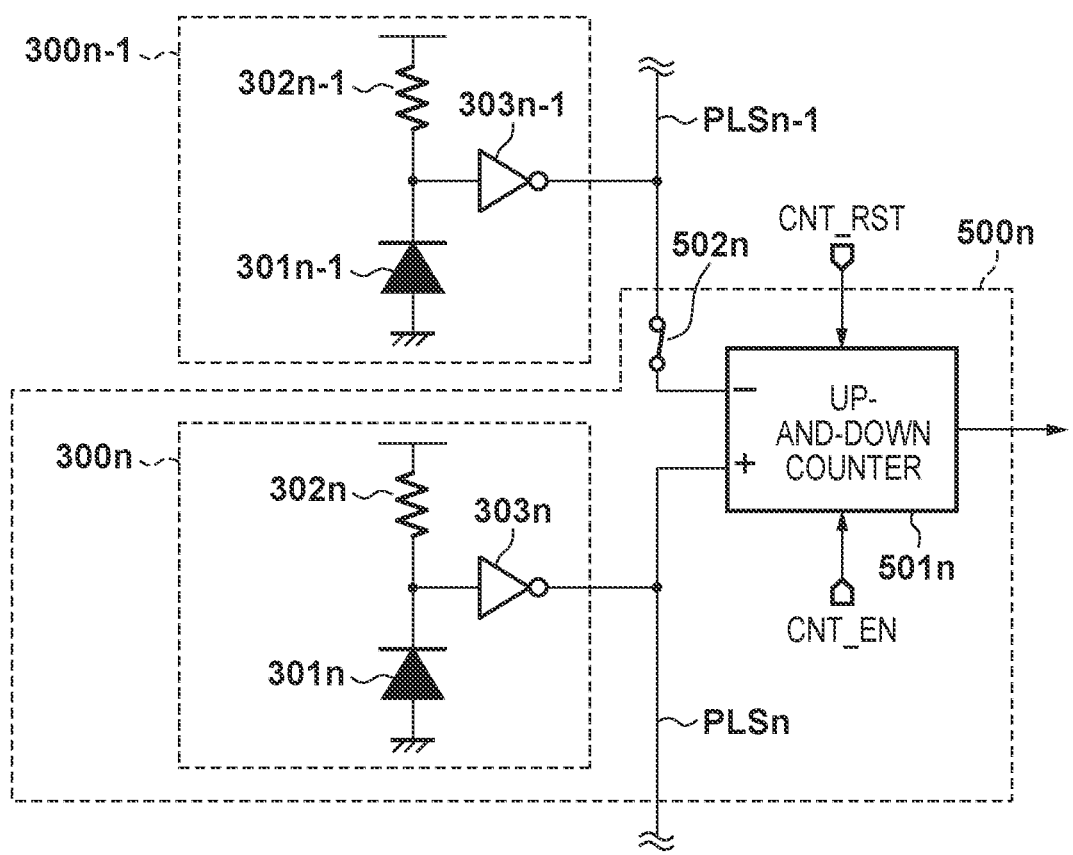
FIG. 5 is an equivalent circuit diagram illustrating a pixel according to a second embodiment.

FIG. 5 is an equivalent circuit diagram illustrating a pixel 500n corresponding to one of the pixels 201 arranged two-dimensionally in the pixel array 200 according to the present embodiment. Constituent elements that are the same as those described in the first embodiment are given the same reference numerals as those in FIG. 3, and redundant descriptions thereof will be omitted. The configuration is different from the first embodiment in that an up-and-down counter circuit 501n is provided instead of the OR circuit 304n and the counter circuit 305n. Note that in FIG. 5, the elements aside from the light-receiving circuit 300n-1 are not shown for a pixel 500n-1 in the n-1th row, in the same manner as in the first embodiment.

The up-and-down counter circuit 501n counts the number of pulses input to an up-count input terminal ("+ terminal" hereinafter) in the up direction, and counts the number of pulses input to a down-count input terminal ("- terminal" hereinafter) in the down direction. The up-and-down counter circuit 501n is configured to perform an up-count of the number of pulses output by the light-receiving circuit 300n of the corresponding pixel 500n. A switch 502n switches between whether or not to input a pulse signal, output by the light-receiving circuit 300n-1 in the pixel 500n-1 at the same horizontal position as the pixel 500n but one row above in the vertical direction, into the - terminal of the up-and-down counter circuit 501n. When the switch 502n is off, the up-and-down counter circuit 501n only performs an up-count of the number of pulses output by the light-receiving circuit 300n of the pixel 500n. The switch 502n is controlled on and off by control signals supplied from the control circuit 208.

The manner in which the signals from the light-receiving circuits 300n and 300n-1 are input to the up-and-down counter circuit 501n will be described next. First, the control circuit 208 turns the switch 502n on. The signal PLSn-1 from the light-receiving circuit 300n-1 is input to the - terminal of the up-and-down counter circuit 501n via the switch 502n. Note that the signal PLSn-1 is also input to the + terminal of an up-and-down counter circuit 501n-1 (not shown). The signal PLSn from the light-receiving circuit 300n is input to the + terminal of the up-and-down counter circuit 501n. Likewise, the signal PLSn is also input to the - terminal of an up-and-down counter circuit 501n+1 via a switch 502n+1 (not shown).

The up-and-down counter circuit 501n performs an up-count of the number of pulses input to the + terminal and a down-count of the number of pulses input to the - terminal. Accordingly, the count value obtained by the up-and-down counter circuit 501n is a difference between the numbers of photons incident on the two light-receiving circuits 300n and 300n-1. This corresponds to a high-pass filter, which obtains the difference between adjacent pixel values, being applied. Accordingly, the count value of the up-and-down counter circuit 501n corresponds to a pixel value obtained by applying a filter for detecting the edges of an object (a high-pass filter) to the pixel signal from the light-receiving circuit 300n.

Figure 6:
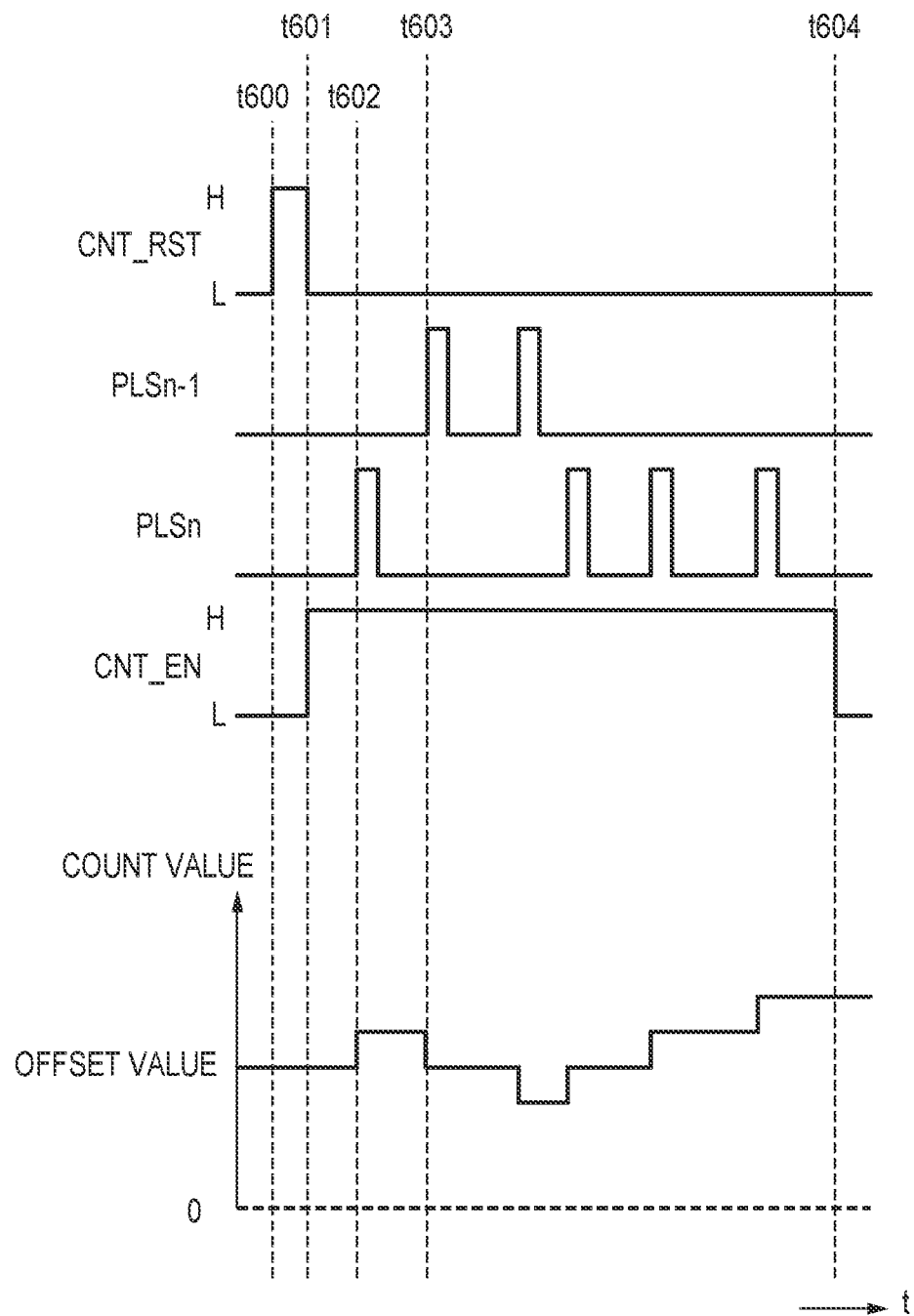
FIG. 6 is a timing chart illustrating an example of a photon counting operation according to the second embodiment.

Operations for counting photons in the pixel 500n illustrated in FIG. 5 will be described next. FIG. 6 is a timing chart illustrating an example of operations for counting photons in the pixel 500n illustrated in FIG. 5. Here, CNT_RST and CNT_EN are supplied from the control circuit 208. In the present embodiment, the count value of the up-and-down counter circuit 501n is reset to a predetermined offset value (>0) when CNT_RST goes to H level. The up-and-down counter circuit 501n counts the input pulses only for the period when CNT_EN is at H level. In other words, CNT_EN is a signal that controls the exposure time.

At time t600, CNT_RST goes from L level to H level, and the count value of the up-and-down counter circuit 501n is reset. Then, at time t601, CNT_RST goes from H level to L level.

Also at time t601, the bias voltage Vbias is supplied to the light-receiving circuits 300n and 300n-1, and a bias voltage greater than or equal to the breakdown voltage is applied to the photodiodes 301n and 301n-1. In response, the photodiodes 301n and 301n-1 operate in Geiger-mode, and produce pulses in the output signals PLSn and PLSn-1 each time a photon is incident. Also at time t601, CNT_EN goes to H level and the up-and-down counter circuit 501n starts the count operations.

At time t602, a rectangular pulse is produced in the output signal PLSn from the light-receiving circuit 300n in response to a photon being incident on the photodiode 301n of the light-receiving circuit 300n. The output signal PLSn is input to the + terminal of the up-and-down counter circuit 501n. As such, the up-and-down counter circuit 501n performs an up-count of that pulse, and the count value becomes the offset value+1.

At time t603, a rectangular pulse is produced in the output signal PLSn-1 from the light-receiving circuit 300n-1 in response to a photon being incident on the photodiode 301n-1 of the light-receiving circuit 300n-1. The up-and-down counter circuit 501n therefore performs a down-count of this pulse, and the count value returns to the offset value.

From time t603 until CNT_EN goes to L level at time t604 and shooting ends, pulses are produced in the output signals PLSn and PLSn-1 each time a photon is incident on the light-receiving circuits 300n and 300n-1. The individual pulses are supplied to the up-and-down counter circuit 501n, and the difference in the number of pulses is counted.

After shooting ends at time t604, the count value of the up-and-down counter circuit 501n is output to the digital output circuit 206 under the control of the vertical selection circuit 202 and the horizontal selection circuit 205, and is furthermore output to the exterior of the image sensor 101.

As described thus far, the image capturing apparatus of the present embodiment is configured so that an image sensor, in which a plurality of pixels (light-receiving circuits) that can detect single photons are arranged, can output the difference between the outputs of a plurality of pixels. Using the difference between the outputs of a plurality of pixels as the output of a single pixel makes it possible to obtain a pixel output to which an edge detection filter (a high-pass filter) has been applied, with a simple configuration.

Note that if a filter is not to be applied, the output signal of the light-receiving circuit 300n may be input to the up-and-down counter circuit 501n. Specifically, the switch 502 is turned off through the control circuit 208. In this manner, whether or not to apply an edge detection filter to a shot image can be controlled dynamically from outside the image sensor. For example, whether to turn the switch 502 on or off can be determined through user settings so as to apply an edge detection filter when using a shot image to inspect the external appearance of an object.

Variation

Figure 7:
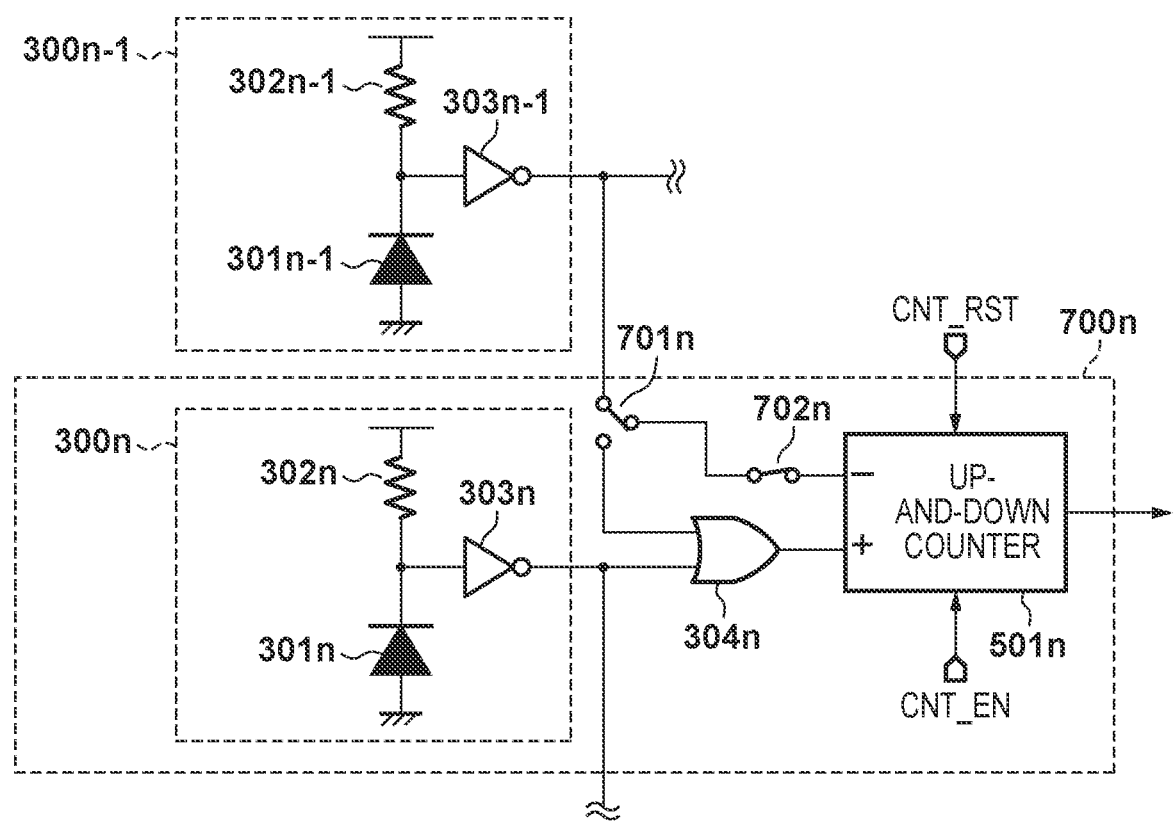
FIG. 7 is an equivalent circuit diagram illustrating a pixel according to the first and second embodiments.

The present embodiment can also be combined with the first embodiment. FIG. 7 is an equivalent circuit diagram illustrating a pixel 700n that enables two types of filters, namely a low-pass filter and an edge detection filter, to be applied selectively. Constituent elements that have already been described are given the same reference signs as in FIGS. 3 and 5. In the present embodiment, the OR circuit 304n is arranged in the stage before the + input of the up-and-down counter circuit 501n, and switches 701n and 702n are provided. The pixel 700n of the present embodiment corresponds to the pixel 201 in FIG. 2.

The switch 701n switches the supply destination of the output signal from the light-receiving circuit 300n−1 between the OR circuit 304n and the switch 702n. The switch 702n switches between whether or not to input the signal supplied through the switch 701n to the − terminal of the up-and-down counter circuit 501n. Both the switches 701n and 702n are controlled by control signals supplied by the control circuit 208.

When a low-pass filter is to be applied to the signal from the pixel 700n, the switch 701n switches so that the output signal from the light-receiving circuit 300n−1 is supplied to the OR circuit 304n. This makes it possible to realize the same configuration as the equivalent circuit diagram illustrated in FIG. 3. Accordingly, the pixel value of the pixel 700n, to which the low-pass filter has been applied, is obtained as the count value of the up-and-down counter circuit 501n. In this case, the switch 702n may be on or off.

When an edge detection filter is to be applied to the signal from the pixel 700n, the switch 701n switches so that the output signal from the light-receiving circuit 300n−1 is supplied to the switch 702n. The switch 702n is also turned on so that the switch 701n and the − terminal of the up-and-down counter circuit 501n are connected. This makes it possible to realize the same configuration as the equivalent circuit diagram illustrated in FIG. 5. Accordingly, the pixel value of the pixel 700n, to which the edge detection filter has been applied, is obtained as the count value of the up-and-down counter circuit 501n.

If the switch 701n is switched so that the output signal of the light-receiving circuit 300n−1 is supplied to the switch 702n, and the switch 702n is turned off, the pixel value of the pixel 700n, to which no filter has been applied, is obtained as the count value of the up-and-down counter circuit 501n.

According to the present variation as described thus far, a pixel value to which no filter is applied, a pixel value to which a low-pass filter is applied, and a pixel value to which an edge detection filter is applied can be obtained selectively under control from the exterior, using a simple configuration.

Third Embodiment

Next, a third embodiment of the present invention will be described. In the present embodiment, the output signals of three light-receiving circuits are weighted (divided) and the number of pulses is then counted, which makes it possible to obtain a pixel value to which a weighted filter is applied. Aside from the configuration of the pixel array 200 in the image sensor 101, the present embodiment may be the same as the first embodiment. As such, the following will describe the configuration and operations of the pixel array 200 according to the present embodiment.

Figure 8:
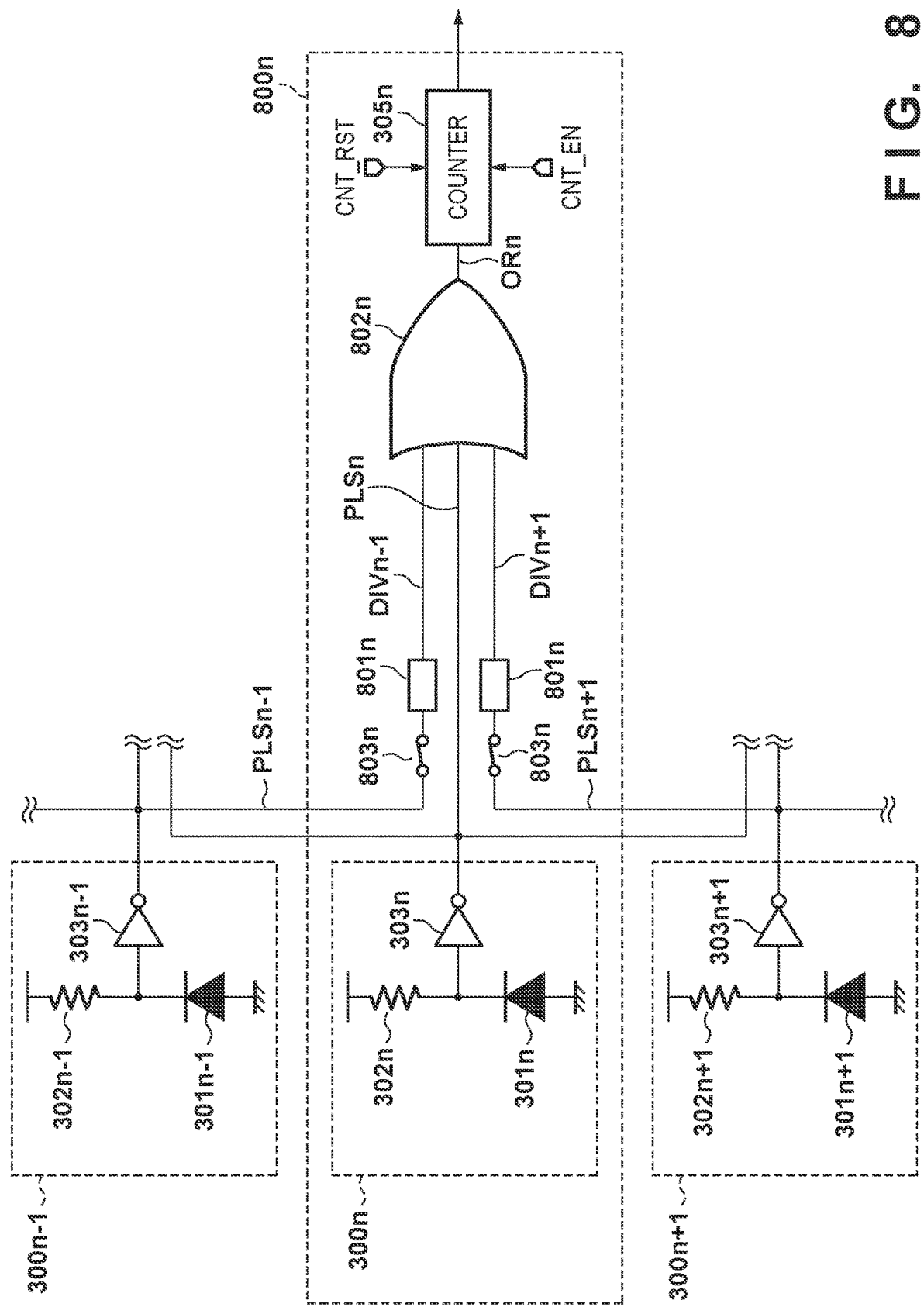
FIG. 8 is an equivalent circuit diagram illustrating a pixel according to a third embodiment.

FIG. 8 is an equivalent circuit diagram illustrating a pixel 800n corresponding to one of the pixels 201 arranged two-dimensionally in the pixel array 200 according to the present embodiment. Constituent elements that are the same as those described in the first embodiment are given the same reference numerals as those in FIG. 3, and redundant descriptions thereof will be omitted. In the present embodiment, an output signal PLSn+1 from a pixel 800n+1 one row below (in the n+1th row) is furthermore input to an OR circuit 802n. Frequency dividers 801n that weight the respective output signals from a pixel 800n−1 and the pixel 800n+1 are also provided. Note that in FIG. 8, the configurations aside from the light-receiving circuit 300n−1 and a light-receiving circuit 300n+1 are not shown for the pixel 800n−1 in the n−1th row and the pixel 800n+1 in the n+1th row.

The two frequency dividers 801n divide H level pulses included in the output signals from the light-receiving circuits 300n−1 and 300n+1 by two (that is, set the number of pulses to ½), and input the divided pulses to the OR circuit 802n. Note that the division ratio of the frequency dividers 801n need not be 2, and may be different from output signal to output signal. The division ratio of the frequency dividers 801n may be variable as well.

Of the three input terminals of the OR circuit 802n, the signals from the frequency dividers 801n are input to two, and the signal from the light-receiving circuit 300n is input to the remaining one. The OR circuit 802n outputs a logical addition signal of the three input signals to the counter circuit 305n. Two switches 803n switch whether or not to input the output signals of the light-receiving circuits 300n−1 and 300n+1 into the frequency dividers 801n. The switches 803n are controlled on and off by control signals supplied from the control circuit 208.

The manner in which the output signals from the light-receiving circuits 300n−1, 300n, and 300n+1 are weighted and input to the counter circuit 305n will be described next. Here, the divided output of the output signal PLSn−1 from the light-receiving circuit 300n−1 is indicated by "DIVn−1", the divided output of the output signal PLSn+1 from the light-receiving circuit 300n+1 is indicated by "DIVn+1", and the output of the OR circuit 802n is indicated by "ORn".

First, the control circuit 208 turns the two switches 803n on. As a result, the output signals PLSn−1 and PLSn+1 from the two light-receiving circuits 300n−1 and 300n+1 are input to the corresponding frequency dividers 801n. The frequency dividers 801n divided the output signals PLSn−1 and PLSn+1 by two. The frequency dividers 801n output the signals DIVn−1 and DIVn+1, in which the number of pulses in the output signals PLSn−1 and PLSn+1 have been reduced to ½.

Accordingly, when both the switches 803n are on, the signals DIVn−1 and DIVn+1 and the output signal PLSn from the light-receiving circuit 300n are input to the OR circuit 802n. Note that the output signal from the light-receiving circuit 300 of each pixel is also input to the frequency divider in the two pixels adjacent above and below (in the example of FIG. 8, the frequency dividers in the pixels 800n−1 and 801n+1).

Using the frequency dividers 801n applies a weight to the output signals PLSn−1 and PLSn+1 from the light-receiving circuits 300n−1 and 300n+1, among the three signals input to the OR circuit 802n, that is ½ that of the output signal PLS from the light-receiving circuit 300n. Alternatively, the weight applied to the output signal PLS is twice the weight applied to the output signals PLSn−1 and PLSn+1. The OR circuit 802n outputs a logical addition signal ORn of the three input signals to the counter circuit 305n. The counter circuit 305n then counts the number of pulses in the logical addition signal ORn.

Using the frequency dividers 801n in this manner makes it possible to weight the output signal of the light-receiving circuit 300. Accordingly, adjusting the division ratios of the frequency dividers 801n makes it possible to adjust the low-pass filter effect applied to the image.

Figure 9:
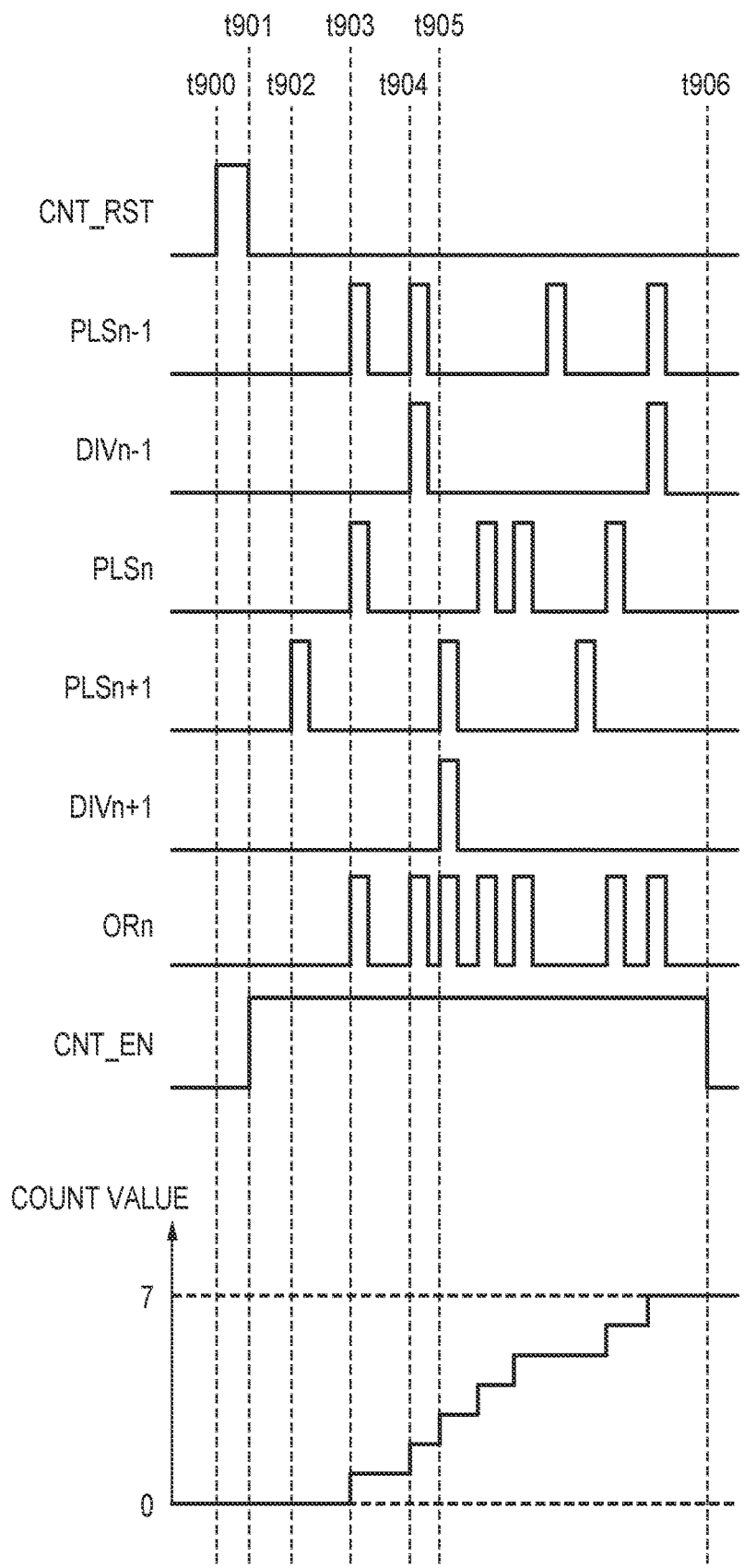
FIG. 9 is a timing chart illustrating an example of a photon counting operation according to the third embodiment.

Operations for counting photons in the pixel 800n illustrated in FIG. 8 will be described next. FIG. 9 is a timing chart illustrating an example of operations for counting photons in the pixel 800n illustrated in FIG. 8. Here, CNT_RST and CNT_EN are the same signals as in the first embodiment, and are supplied from the control circuit 208. In the present embodiment, the count value of the up-and-down counter circuit 501n is reset to 0 when CNT_RST goes to H level, and the counter circuit 305n counts the input pulses only during the period when CNT_EN is at H level. In other words, CNT_EN is a signal that controls the exposure time.

At time t900, CNT_RST goes from L level to H level, and the count value of the up-and-down counter circuit 501n is reset. Then, at time t901, CNT_RST goes from H level to L level.

Also at time t901, the bias voltage Vbias is supplied to the light-receiving circuits 300n−1, 300n, and 300n+1, and a bias voltage greater than or equal to the breakdown voltage is applied to the photodiodes 301n−1, 301n, and 301n+1. In response, the photodiodes 301n−1, 301n, and 301n+1 operate in Geiger-mode, and produce pulses in the output signals PLSn+1, PLSn, and PLSn−1 each time a photon is incident. At time t901, CNT_EN goes to H level and the counter circuit 305n starts the count operations.

At time t902, a rectangular pulse is produced in the output signal PLSn+1 from the light-receiving circuit 300n+1 in response to a photon being incident on the photodiode 301n+1 of the light-receiving circuit 300n+1. The output signal PLSn+1 is input to the frequency divider 801n. The frequency dividers 801 of the present embodiment divide at a division ratio of 2 by outputting the 2mth (where m is an integer of 1 or more) pulse but not outputting the 2m−1th pulse. Thus at this point in time, the level of the output signal DIVn+1 from the frequency divider 801n remains at L level. Photons are not incident on the other photodiodes 301n and 301n−1 of the other light-receiving circuits 300n and 300n−1, and thus all the input signals to the OR circuit 802n are at L level. The output signal ORn from the OR circuit 802n also stays at L level, and the count value of the counter circuit 305n stays at the initial value (0).

At time t903, rectangular pulses are produced in the output signals PLSn and PLSn−1 from the light-receiving circuits 300n and 300n−1 in response to photons being incident on the photodiodes 301n and 301n−1 of the light-receiving circuits 300n and 300n−1. The output signal PLSn−1 from the light-receiving circuit 300n−1 is input to the frequency divider 801n, but because this is the first pulse, the output signal DIVn−1 stays at L level. However, the pulse in the output signal PLSn from the light-receiving circuit 300n is reflected in the output signal ORn from the OR circuit 802n, and thus the count value of the counter circuit 305n is incremented by 1.

At time t904, a rectangular pulse is produced in the output signal PLSn−1 from the light-receiving circuit 300n−1 in response to a photon being incident on the photodiode 301n−1 of the light-receiving circuit 300n−1. This is the second pulse produced in the output signal PLSn−1 from the light-receiving circuit 300n-1, and thus the frequency divider 801n allows the pulse to be produced in the output signal DIVn−1. This pulse is reflected in the output signal ORn from the OR circuit 802n, and thus the count value of the counter circuit 305n is incremented by 1.

At time t905, a rectangular pulse is produced in the output signal PLSn+1 from the light-receiving circuit 300n+1 in response to a photon being incident on the photodiode 301n+1 of the light-receiving circuit 300n+1. This is the second pulse produced in the output signal PLSn+1 from the light-receiving circuit 300n+1, and thus the frequency divider 801n allows the pulse to be produced in the output signal DIVn+1. This pulse is reflected in the output signal ORn from the OR circuit 802n, and thus the count value of the counter circuit 305n is incremented by 1.

From time t905 until CNT_EN goes to L level at time t906 and shooting ends, pulses are produced in the output signals PLSn−1, PLS, and PLSn+1 each time a photon is incident on the light-receiving circuits 300n−1, 300n, and 300n+1. Every two pulses of the output signals PLSn−1 and PLSn+1, and every pulse of the output signal PLS, are reflected in the logical addition signal ORn, and the counter circuit 305n counts the number of pulses.

After shooting ends at time t906, the count value of the counter circuit 305n is output to the digital output circuit 206 under the control of the vertical selection circuit 202 and the horizontal selection circuit 205, and is furthermore output to the exterior of the image sensor 101.

Here, the difference between applying and not applying the weighting using the frequency dividers 801n will be explained. When the weighting is applied, the count value of the counter circuit 305n is 7 at time t906, as indicated in FIG. 9. If no weighting is applied using the frequency dividers 801n, and the output signals PLSn−1 and PLSn+1 from the light-receiving circuits 300n−1 and 300n+1 are input directly to the OR circuit 802n, the count value will be 10 at time t906. In either case, the output signal PLS from the light-receiving circuit 300n will not be weighted, and the four pulses produced in the output signal PLSn from time t901 to t906 will be directly input to the OR circuit 802n. In the example illustrated in FIG. 9, photons are not incident on the three light-receiving circuits 300n−1, 300n, and 300n+1 at the same time. Accordingly, of the count values, the count value produced by pulses in the output signal PLSn from the light-receiving circuit 300n is 4. In other words, the output signal PLSn from the light-receiving circuit 300n occupies 4/7 of the count value if weighting is applied, and 4/10 if weighting is not applied. Applying a lower weighting to the output signals PLSn−1 and PLSn+1 from the light-receiving circuits 300n−1 and 300n+1 than to the output signal PLSn from the light-receiving circuit 300n makes it possible to increase the count value occupied by the output signal PLSn when weighting is applied.

As described thus far, the image capturing apparatus of the present embodiment is configured so that an image sensor, in which a plurality of pixels (light-receiving circuits) that can detect single photons are arranged, can output a weighted addition result of the outputs of a plurality of pixels. Using that weighted addition result as the output of a single pixel makes it possible to obtain a pixel output to which a low-pass filter, which applies weighting from adjacent pixel value signals, has been applied, with a simple configuration. This makes it possible to obtain a high-quality image signal (image), in which the effects of noise are reduced, while leaving edge information of an object as a result of the weighting.

Note that it is also possible to avoid applying a filter by turning both the switches 803n off through the control circuit 208.

Fourth Embodiment

Next, a fourth embodiment of the present invention will be described. In the first to third embodiments, whether or not to apply a spatial filter to a shot image, the type of filter to be applied, and so on are selected by controlling switches on and off before shooting. In the present embodiment, control pertaining to the application of a filter across a plurality of frames (in the time axis direction) is realized by controlling switches on and off during shooting.

Figure 10:
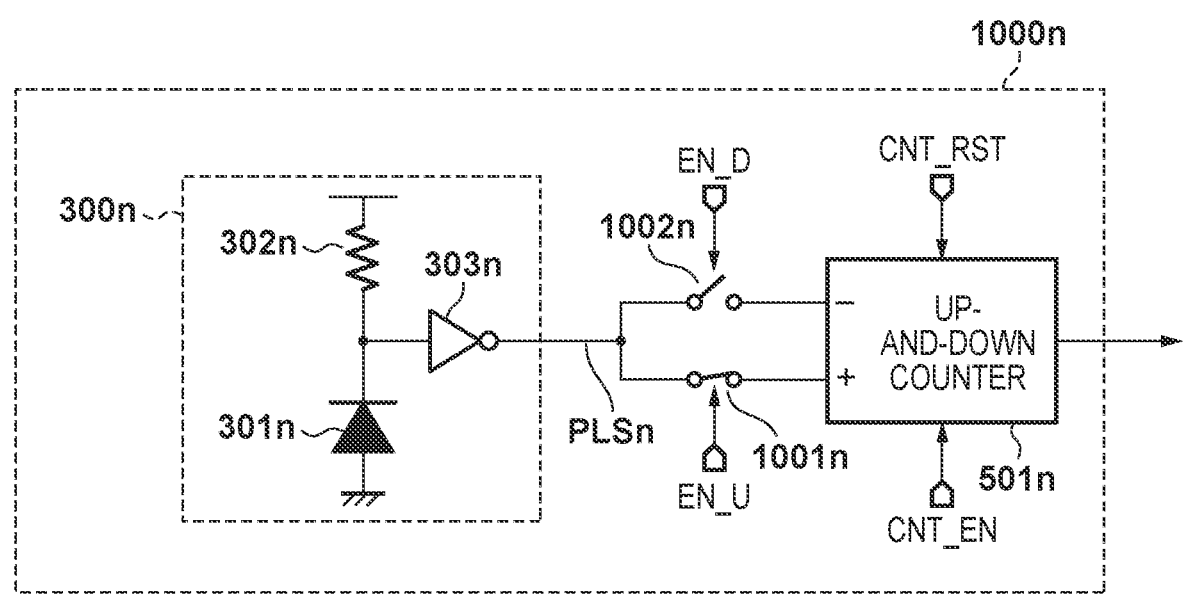
FIG. 10 is an equivalent circuit diagram illustrating a pixel according to a fourth embodiment.

Aside from the configuration of the pixel array 200 in the image sensor 101, the present embodiment may be the same as the first embodiment. As such, the following will describe the configuration and operations of the pixel array 200 according to the present embodiment. FIG. 10 is an equivalent circuit diagram illustrating a pixel 1000n corresponding to one of the pixels 201 arranged two-dimensionally in the pixel array 200 according to the present embodiment. Constituent elements that are the same as those described in the first and second embodiments are given the same reference numerals as those in FIGS. 3 and 5, and redundant descriptions thereof will be omitted.

Switches 1001n and 1002n switch whether the output signal from the light-receiving circuit 300n is to be input to the + terminal or the − terminal of the up-and-down counter circuit 501n (or not input at all). The switches 1001n and 1002n are controlled on and off by control signals supplied from the control circuit 208. Switching the switches 1001n and 1002n on and off during shooting makes it possible to apply a filter in the temporal direction. Using a filter in the temporal direction makes it possible to detect whether or not an object is moving.

Figure 11:
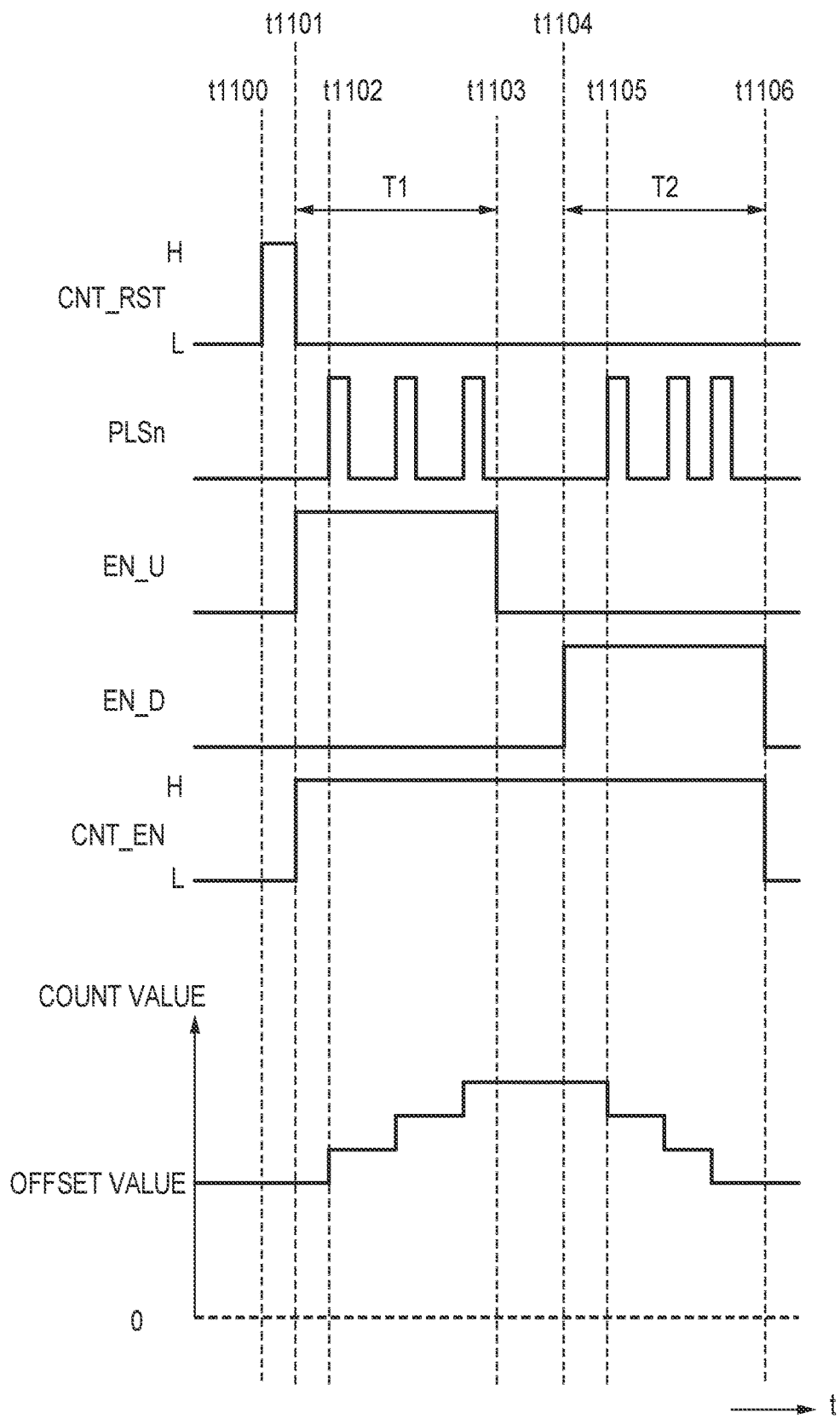
FIG. 11 is a timing chart illustrating an example of a photon counting operation according to the fourth embodiment.

Operations for counting photons in the pixel 1000n illustrated in FIG. 10 will be described next. FIG. 11 is a timing chart illustrating an example of operations for counting photons in the pixel 1000n. In FIG. 11, signals controlling the switches 1001n and 1002n on and off, which are supplied from the control circuit 208, are indicated by "EN_U" and "EN_D", respectively. Here, CNT_RST and CNT_EN are the same signals as in the first and second embodiments, and are supplied from the control circuit 208. In the present embodiment, the count value of the up-and-down counter circuit 501n is reset to a predetermined offset value (>0) when CNT_RST goes to H level, and the counter circuit 305n counts the input pulses only during the period when CNT_EN is at H level. In other words, CNT_EN is a signal that controls the exposure time.

At time t1100, CNT_RST goes from L level to H level, and the count value of the up-and-down counter circuit 501n is reset to the offset value. Then, at time t1101, CNT_RST goes from H level to L level.

At time t1101, the bias voltage Vbias is supplied to the light-receiving circuit 300n. A bias voltage greater than or equal to the breakdown voltage is applied to the photodiode 301n. In response, the photodiode 301n operates in Geiger-mode, and produces a pulse in the output signal PLS each time a photon is incident. Also at time t1101, CNT_EN goes to H level and the up-and-down counter circuit 501n starts the count operations.

At time t1101, EN_U goes to H level (with EN_D remaining at L level), the switch 1001n is turned on, and the switch 1002n is turned off. As a result, the output signal PLSn from the light-receiving circuit 300n is input to only the + terminal of the up-and-down counter circuit 501n.

At time t1102, a rectangular pulse is produced in the output signal PLSn in response to a photon being incident on the photodiode 301n of the light-receiving circuit 300n. This pulse is input to the + terminal of the up-and-down counter circuit 501n via the switch 1001n, and the up-and-down counter circuit 501n increases the count value by 1 (+1).

From time t1102 until EN_U goes to L level at time t1103, a pulse is produced in the output signal PLSn each time a photon is incident on the light-receiving circuit 300n, and the count value of the up-and-down counter circuit 501n rises. The period for which EN_U is set to H level (from time t1101 to time t1103) will be called a "first image capturing period T1".

At time t1103, EN_U goes to L level and the switch 1001n turns off. As a result, the output signal PLSn from the light-receiving circuit 300n is no longer input to the + terminal of the up-and-down counter circuit 501n. At this point in time, EN_D is also at L level, and thus the output signal PLSn from the light-receiving circuit 300n is not input to the − terminal of the up-and-down counter circuit 501n as well.

At time t1104, EN_D goes to H level and the switch 1002n turns on. As a result, the output signal PLSn from the light-receiving circuit 300n is input only to the − terminal of the up-and-down counter circuit 501n.

At time t1105, a rectangular pulse is produced in the output signal PLSn in response to a photon being incident on the photodiode 301n of the light-receiving circuit 300n. This pulse is input to the − terminal of the up-and-down counter circuit 501n via the switch 1002n, and the up-and-down counter circuit 501n reduces the count value by 1 (−1).

From time t1105 until EN_D goes to L level at time t1106, a pulse is produced in the output signal PLSn each time a photon is incident on the light-receiving circuit 300n, and the count value of the up-and-down counter circuit 501n falls. The period for which EN_D is set to H level (from time t1104 to time t1106) will be called a "second image capturing period T2". Note that the control circuit 208 controls the period T1 for which EN_U is at H level and the period T2 for which EN_D is at H level so that the first image capturing period T1 and the second image capturing period T2 are equal (T1=T2).

When EN_D goes to L level at time t1106, the switch 1002n turns off, and the output signal PLSn from the light-receiving circuit 300n is no longer input to the − terminal of the up-and-down counter circuit 501n. CNT_EN goes to L level and the image capturing ends. After shooting ends at time t1106, the count value of the up-and-down counter circuit 501n in the pixel 1000n is output to the digital output circuit 206 under the control of the vertical selection circuit 202 and the horizontal selection circuit 205, and is furthermore output to the exterior of the image sensor 101.

In this manner, the configuration is such that the difference between the numbers of pulses in two image capturing periods are counted, and thus an image signal in which a filter has been applied in the temporal direction can be obtained. For example, when the first image capturing period T1 and the second image capturing period T2 are taken as the image capturing periods of sequential frames when shooting a moving image, pixel values will not change in regions where there is no change between the frames, and thus the count value is the initial value (the offset value) at the point in time when the second image capturing period T2 ends. However, for regions that have changed between frames, the count value will differ from the offset value at the point in time when the second image capturing period T2 ends. In other words, confirming whether or not the count value for a given pixel is the offset value makes it possible to detect whether or not there has been a change (e.g., movement) in an object at that pixel.

As described thus far, the image capturing apparatus of the present embodiment is configured so that an image sensor, in which a plurality of pixels (light-receiving circuits) that can detect single photons are arranged, can output a difference between pixel values in the time axis direction. Accordingly, a filter in the time axis direction, which detects whether or not there has been a change between images, can be applied, with a simple configuration. Note that keeping the switch 1002n off through the control circuit 208 makes it possible to avoid applying a filter in the time axis direction. Thus using the image capturing apparatus of the present embodiment in a device that operates continually, such as a surveillance camera, makes it easy to detect whether or not an object is moving.

Fifth Embodiment

Next, a fifth embodiment of the present invention will be described. The first to fourth embodiments describe a configuration in which each pixel is provided with a counter that counts a number of pulses. However, from the standpoint of suppressing an increase in the circuit scale, it is preferable that counters not be provided in the individual pixels. For example, a configuration is conceivable in which a counter is disposed outside the pixels as a peripheral circuit of the image sensor and the output signals from the pixels (the light-receiving circuits) are then transferred to the counter. Furthermore, a configuration is conceivable in which the image sensor has a stacked structure, with a pixel array disposed on a first board and a counter disposed on a second board, and the output signals from the pixels (the light-receiving circuits) are transferred from the first board to the second board using through-silicon vias (TSVs) or the like. However, with the former configuration, wires are required for transferring the signals from the individual pixels, which can be expected to increase the circuit scale and worsen the yield.

The present embodiment provides an image sensor having a configuration through which the inventions according to the first to fourth embodiments can be carried out, but which also suppresses the circuit scale. Note that "pixel" as used in the present embodiment corresponds to the light-receiving circuits in the first to fourth embodiments.

Figure 12:
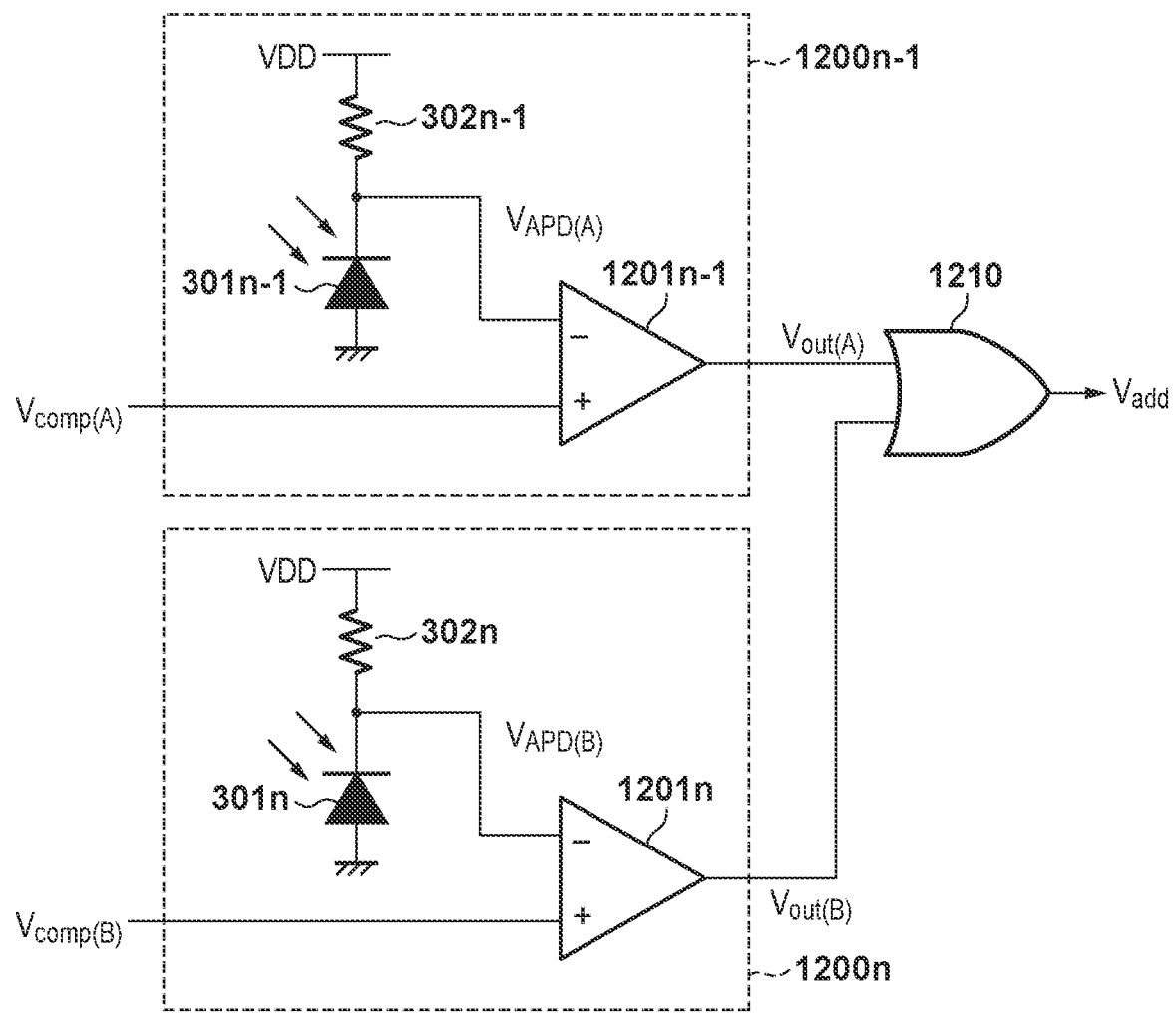
FIG. 12 is an equivalent circuit diagram illustrating a pixel according to a fifth embodiment.

FIG. 12 illustrates the configuration of a pixel circuit including a pixel 1200, which is included in the pixel array 200 of the image sensor 101 according to the fifth embodiment of the present invention. Configurations that are the same as in the embodiments described earlier are given the same reference signs.

The pixel 1200 includes an avalanche photodiode (called simply a "photodiode" hereinafter) 301, a quenching resistor 302, and a comparison circuit 1201. In FIGS. 12, 1200n and 1200n+1 indicate two pixels, with the elements in the pixel 1200n distinguished by the letter n and the elements in the pixel 1200n+1 distinguished by n+1. These suffixes are not appended to items that apply to all of the pixels.

A comparison circuit 1201 compares an output signal from a photodiode 301 with a predetermined comparison signal Vcomp, and outputs a signal expressing a comparison result. Note that the comparison signal Vcomp is supplied from a pixel control circuit 1221, which will be described later. In the present embodiment, the comparison circuit 1201 outputs at H level when a voltage drop, which is produced in response to a photon being incident on the photodiode 301, drops below a threshold voltage Vref. Here, the threshold voltage Vref is set to a voltage that both enables a pulse signal produced when a photon is incident on the photodiode 301 to be detected, and prevents VDD noise, crosstalk from adjacent pixels, and so on from being erroneously detected. Additionally, setting the comparison signal Vcomp to a voltage Vdis at which a pulse signal produced when a photon is incident on the photodiode 301 is not detected makes it possible to invalidate the output of the comparison circuit 1201.

In the example illustrated in FIG. 12, the two pixels 1200n-1 and 1200n are input to a single OR circuit 1210. The OR circuit 1210 outputs H level when the output signal of either one of the pixels 1200n-1 and 1200n is H level. As such, the output signal from the OR circuit 1210 can be called a multiplexed signal of the output signals from the pixels 1200n-1 and 1200n.

Operations of the circuit illustrated in FIG. 12 will be described next using the timing chart illustrated in FIG. 13. A comparison signal Vcomp(A) input to a comparison circuit 1201n-1 is a square wave in which the threshold voltage Vref and Vdis repeat at a cycle t[s]. When, during the period in which Vcomp(A) is at the threshold voltage Vref, a photon is incident on a photodiode 301a and a pulse voltage VAPD(A) drops below the threshold voltage Vref, an output Vout(A) from the comparison circuit 1201n-1 goes to H level. In other words, the period for which the H level output from the comparison circuit 1201n-1 is input to the OR circuit 1210 is limited to the period for which Vcomp(A) is the threshold voltage Vref.

During the period for which Vcomp(A) is the voltage Vdis, the output of the comparison circuit 1201n-1 is L level regardless of the value of the voltage VAPD(A) from the photodiode 301. In other words, no pulse is output during the period when Vcomp(A) is the voltage Vdis. Here, the duty ratio of the threshold voltage Vref during the cycle t[s] is less than or equal to 50%. More generally, if the number of pixels 1200 input to a single OR circuit 1210 is set to N (where N is an integer of 2 or more), the duty at which Vcomp(A) is the threshold voltage Vref is less than or equal to 1/N. The incidence of photons can be detected without missing any photons by setting the cycle t[s] to a value that is shorter than the period for which the pulse-shaped voltage change, which is produced in the voltage VAPD when a photon is incident on the photodiode 301, drops below the threshold voltage Vref.

Figure 13:
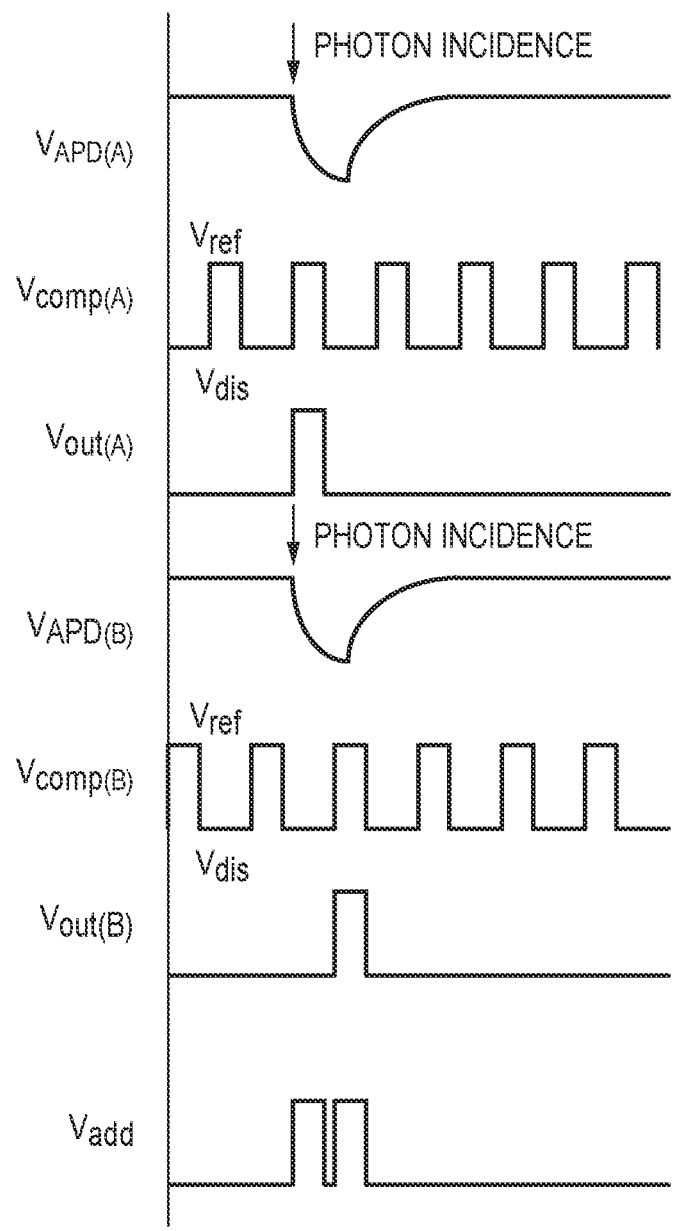
FIG. 13 is a timing chart illustrating operations of the pixel according to the fifth embodiment.

FIG. 13 illustrates operations when photons are incident on the photodiodes 301n-1 and 301n at the same time. In the present embodiment, the phases of voltages Vcomp(A) and Vcomp(B), which are input to the two comparison circuits 1201n-1 and 1201n shared by the one OR circuit 1210, are shifted. Specifically, the phases are shifted so that Vcomp(A) and Vcomp(B) do not become the threshold voltage Vref at the same time.

In other words, in a period corresponding to a single cycle t[s], the phase of Vcomp is shifted for the plurality of pixels 1200 connected in common to the OR circuit 1210 so that the periods for which pulses are actively output from the comparison circuits 1201 do not overlap. Unless this is done, when photons are incident on the photodiodes 301 of different pixels 1200 at the same time, pulses produced in the output signals from the photodiodes 301 will be counted together as a single pulse.

According to the configuration of the present embodiment, a pulse is based on pulse-shaped voltage changes produced in the voltages VAPD(A) and VAPD(B) are input to the OR circuit 1210 in different periods, even in a case where, for example, photons are incident on the photodiodes 301n−1 and 301n at the same time. As such, two pulses are present in an output signal Vadd from the OR circuit 1210, and the actual number of photons that are incident is correctly counted by a counter circuit provided in a later stage.

An example of the configuration of a signal processing circuit according to the present embodiment will be described next using FIG. 14A. As will be described later, a signal processing circuit 1220 is provided in a board, among a plurality of boards constituting the image sensor 101, in which the pixel array is not provided. The signal processing circuit 1220 includes a demultiplexer (DEMUX) 1224 and pulse counters 1223a and 1223b. The output signal Vadd from the OR circuit 1210 is input to the demultiplexer 1224, which carries out a demultiplexing operation for dividing the pulses in Vadd between the pulse counters 1223a and 1223b in accordance with a control signal SDEMUX. The control signal SDEMUX is supplied from a demultiplexer control circuit 1222, which will be described later.

The control signal SDEMUX separates the pulse originating from the pixel 1200n−1 and the pulse originating from the pixel 1200n, which are present in Vadd, and supplies the former to the pulse counter 1223a and the latter to the pulse counter 1223b. The pulse counters 1223a and 1223b count the number of pulses in the signals supplied from the demultiplexer 1224. The pulse counter 1223a counts the number of photons incident on the pixel 1200n−1, and the pulse counter 1223b counts the number of photons incident on the pixel 1200n. The pulse counters 1223a and 1223b output the count values to outside the signal processing circuit 1220 in accordance with pulse counter control signals supplied from the control circuit 208, and the count values are reset.

An example of the configuration of the image sensor 101 according to the present embodiment will be described next using to FIG. 14B. The image sensor 101 has a structure in which a first board 101A and a second board 101B are stacked. The first board 101A and the second board 101B are electrically connected through TSVs, for example. The pixel array 200, in which a plurality of pixels 1200 are arranged in a matrix, is formed in the first board 101A.

Here, the OR circuits 1210 and the pixel control circuit 1221 are included in the first board 101A. On the other hand, a plurality of signal processing circuits 1220 provided corresponding to the plurality of OR circuits 1210 provided in the first board 101A and receiving the output signals Vadd from the OR circuits 1210, and the demultiplexer control circuit 1222, are provided in the second board 101B.

The demultiplexer control circuit 1222 receives the control signal SDEMUX from the pixel control circuit 1221 in the first board 101A. The demultiplexer control circuit 1222 then supplies the control signal SDEMUX to the demultiplexers 1224 in the plurality of signal processing circuits 1220 provided in the second board 101B. As a result, the demultiplexers 1224 present in the individual signal processing circuits 1220 separate the pulses originating from the plurality of pixels 1200, present in the output signals Vadd from the OR circuits 1210, into pulses corresponding to each signal.

In the present embodiment, the output signals from two of the pixels 1200 are multiplex into a single signal by the OR circuit 1210. This makes it possible to reduce the number of electrodes, such as vias and TSVs, for connecting the first board 101A, in which the pixel array 200 is provided, to the second board 101B, in which the signal processing circuits 1220 are provided, by half. This in turn makes it possible to suppress the circuit scale. Note that the reliability of the connection may be improved by connecting a single pixel to the corresponding signal processing circuit 1220 over two parallel paths, without reducing the number of vias, TSVs, and so on by half. It is not necessary for the image sensor 101 to have a stacked structure, and the configuration may be such that the signal processing circuits 1220, the demultiplexer control circuit 1222, and so on are provided on the same board as peripheral circuits of the pixel array. In this case as well, the amount of wiring between the pixels and the signal processing circuits 1220 can be reduced by half through the multiplexing carried out by the OR circuits 1210, which helps suppress the circuit scale. Additionally, the number of signals multiplexed by the OR circuits 1210 (the number of pixels 1200 shared by a single OR circuit 1210) may be three or more.

The present embodiment describes a configuration in which the signal from the photodiode 301 is input to the comparison circuit 1201. However, the configuration may be such that the signal from the photodiode 301 is input to a counter as a synchronization signal. Using the signal that controls the comparison circuit 1201 as a synchronization signal makes it possible to configure the counter circuit as a synchronized counter.

Sixth Embodiment

Next, a sixth embodiment of the present invention will be described. The fifth embodiment describes a configuration in which the output signal from the OR circuit 1210 is separated by the demultiplexer 1224. However, using a configuration in which the output of the OR circuit 1210 is input directly to the pulse counters 1223 and the number of pulses is counted makes it possible to obtain an added signal of the pixels 1200 shared by the OR circuit 1210. In this case, the demultiplexer 1224 supplies the output signal from the OR circuit 1210 to one of the pulse counters 1223a and 1223b without demultiplexing that signal.

Methods known as "additive readout" or "pixel mixing" are known as past methods for obtaining an image having a lower resolution than the resolution (number of pixels) of the image sensor. Weighted addition of pixel signals is also sometimes carried out in order to increase the apparent resolution of an image, correct deviations in color centroids, and so on. Carrying out such addition processes on analog pixel signals requires a dedicated analog circuit, which increases the circuit scale. On the other hand, digitizing the pixel signals and then carrying out the addition process means that calculation processes are required. The present embodiment describes a configuration that realizes weighted addition of pixel signals while requiring neither a dedicated circuit nor a calculation process.

Figure 15:
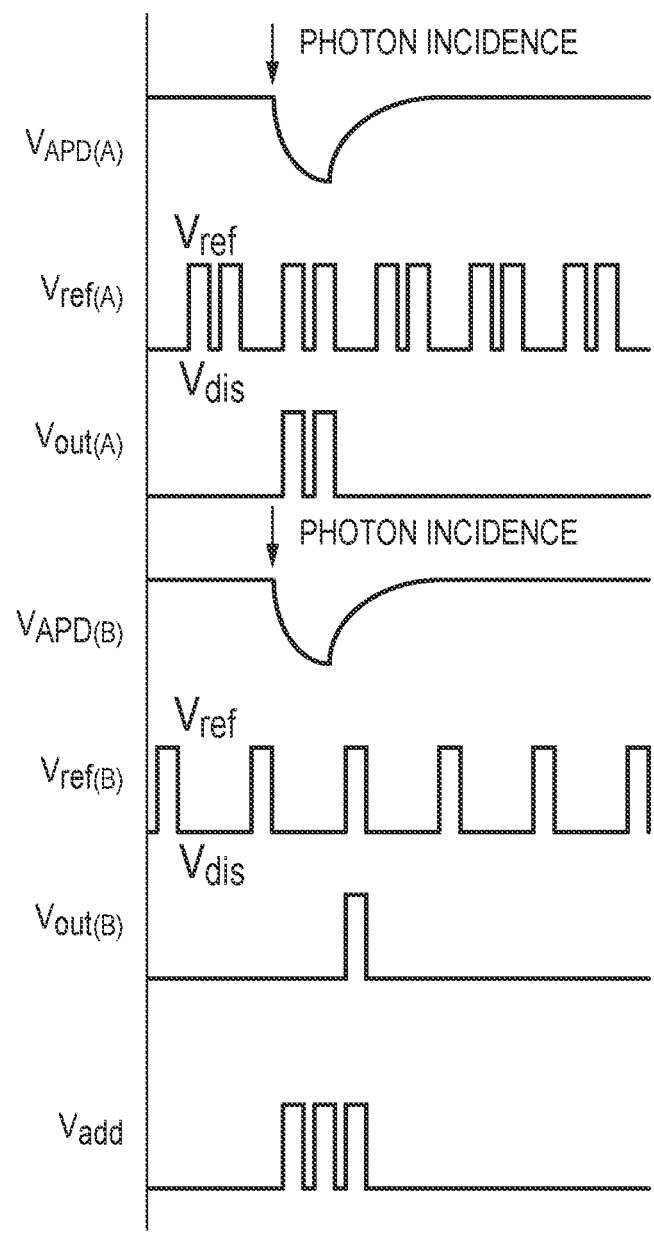
FIG. 15 is a timing chart illustrating operations of the pixel according to a sixth embodiment.

FIG. 15 is a timing chart illustrating weighted addition of the signals from the pixels 1200n−1 and 1200n, configured as illustrated in FIG. 12, at 2:1, and the output of the signals. As in FIG. 13, FIG. 15 illustrates a case where photons are incident on the photodiodes 301n−1 and 301n of the pixels 1200n-1 and 1200n at the same time. The basic operations are the same as those described in the fifth embodiment with reference to FIG. 13, and thus only different points will be described here. Once again, "pixel" as used in the present embodiment corresponds to the light-receiving circuits in the first to fourth embodiments.

In the present embodiment, different weights are applied pixel signals by varying the number of times the voltage Vcomp input to the comparison circuit 1201 reaches the threshold voltage Vref, on a pixel-by-pixel basis. Here, a weight twice that applied to the signal from the pixel 1200n is applied to the signal from the pixel 1200n-1, and thus the period in which Vcomp(A) input to the comparison circuit 1201n-1 reaches the threshold voltage Vref occurs twice per cycle. On the other hand, the period for which the voltage Vcomp(B) input to the comparison circuit 1201n reaches the threshold voltage Vref stays at one occurrence per cycle.

In this manner, the number of times the voltage Vcomp reaches the threshold voltage Vref in a period in which a pulse-shaped voltage change produced by the photodiode 301 can be output from the comparison circuit 1201 is varied in accordance with the ratio of the weighting applied. As a result, the output signal Vout(A) of the comparison circuit 1201n-1 contains two pulses for every single photon incident on the photodiode 301n-1. On the other hand, the output signal Vout(B) from the comparison circuit 1201n contains one pulse for every single photon incident on the photodiode 301n. Inputting the output signals Vout(A) and Vout(B) directly into the OR circuit 1210 results in an output signal ORn containing three pulses being obtained from the OR circuit 1210.

Figure 14A:
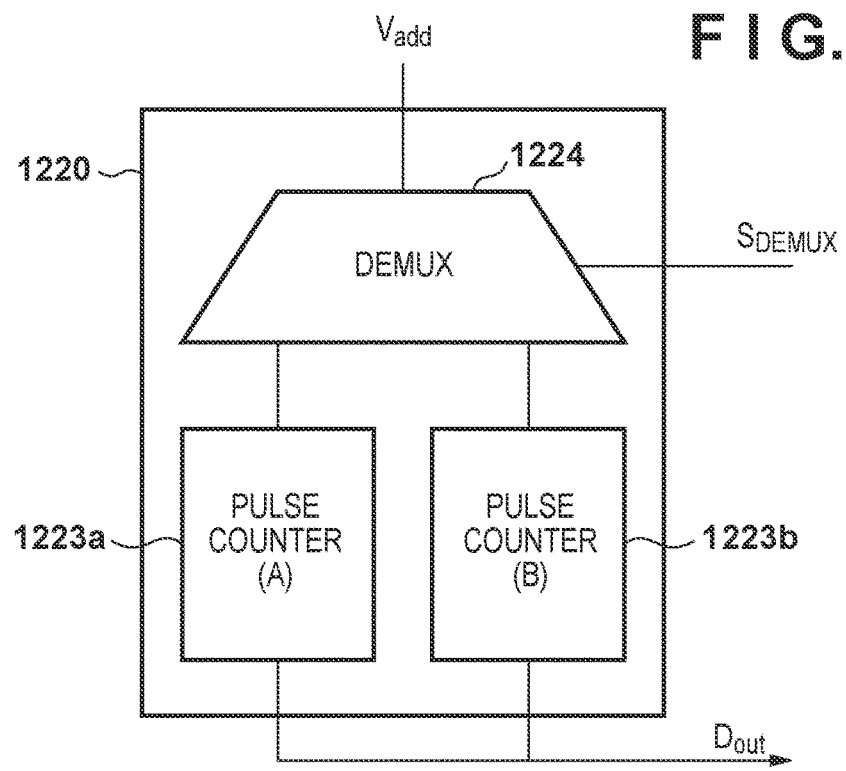
FIGS. 14A to 14B are schematic diagrams illustrating a signal processing circuit and an image sensor according to the fifth embodiment.
Figure 14B:
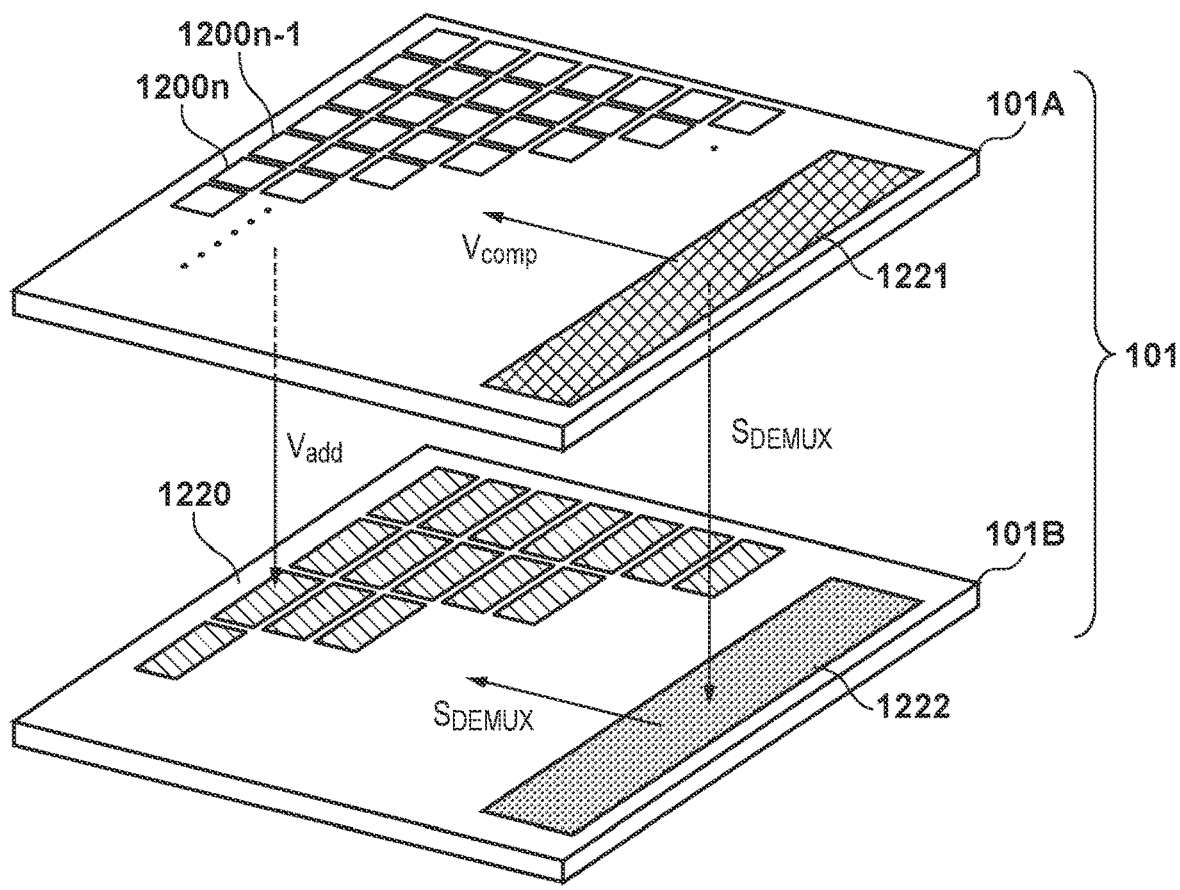

The configuration of the signal processing circuit 1220 may be the same as that described in the fifth embodiment with reference to FIG. 14A, with the output signal Vadd from the signal processing circuit 1220 being input to the demultiplexer 1224. The demultiplexer 1224 is controlled by the control signal SDEMUX output from the demultiplexer control circuit 1222, but in the present embodiment, the output signal Vadd is not demultiplexed, and is instead input directly into one of the pulse counters 1223a and 1223b.

As a result, the pulse counters 1223 count all the pulses present in Vadd, and a pixel value obtained through weighted addition is obtained as the count value. Note that the demultiplexer control circuit 1222 may operate in a mode in which the demultiplexers 1224 are operated and a mode in which the demultiplexers 1224 are not operated (an "additive mode") using the control signal SDEMUX. If addition is to be carried out continually, the demultiplexers 1224, the demultiplexer control circuit 1222, and so on may be omitted.

According to the present embodiment, control is carried out to generate a number of pulses based on weighting, from pulse-shaped voltage changes produced when a single photon is incident, and thus a pixel signal obtained by weighted addition can be obtained without requiring a dedicated circuit, calculation processing, or the like.

Seventh Embodiment

Next, a seventh embodiment of the present invention will be described. The image sensor according to the present embodiment has a configuration in which a single microlens is shared among a plurality of APDs, and is thus an image sensor that can obtain both an image capturing signal and a phase difference AF signal. In a configuration where N (where N is an integer of 2 or more) APDs share a single microlens, N times the number of counters are necessary than in a normal configuration (where one APD is provided for one microlens). However, in the present embodiment, the required number of counters is less than N times, in an image sensor having a configuration in which N APDs (where N is an integer of 2 or more) share a single microlens.

Figure 16:
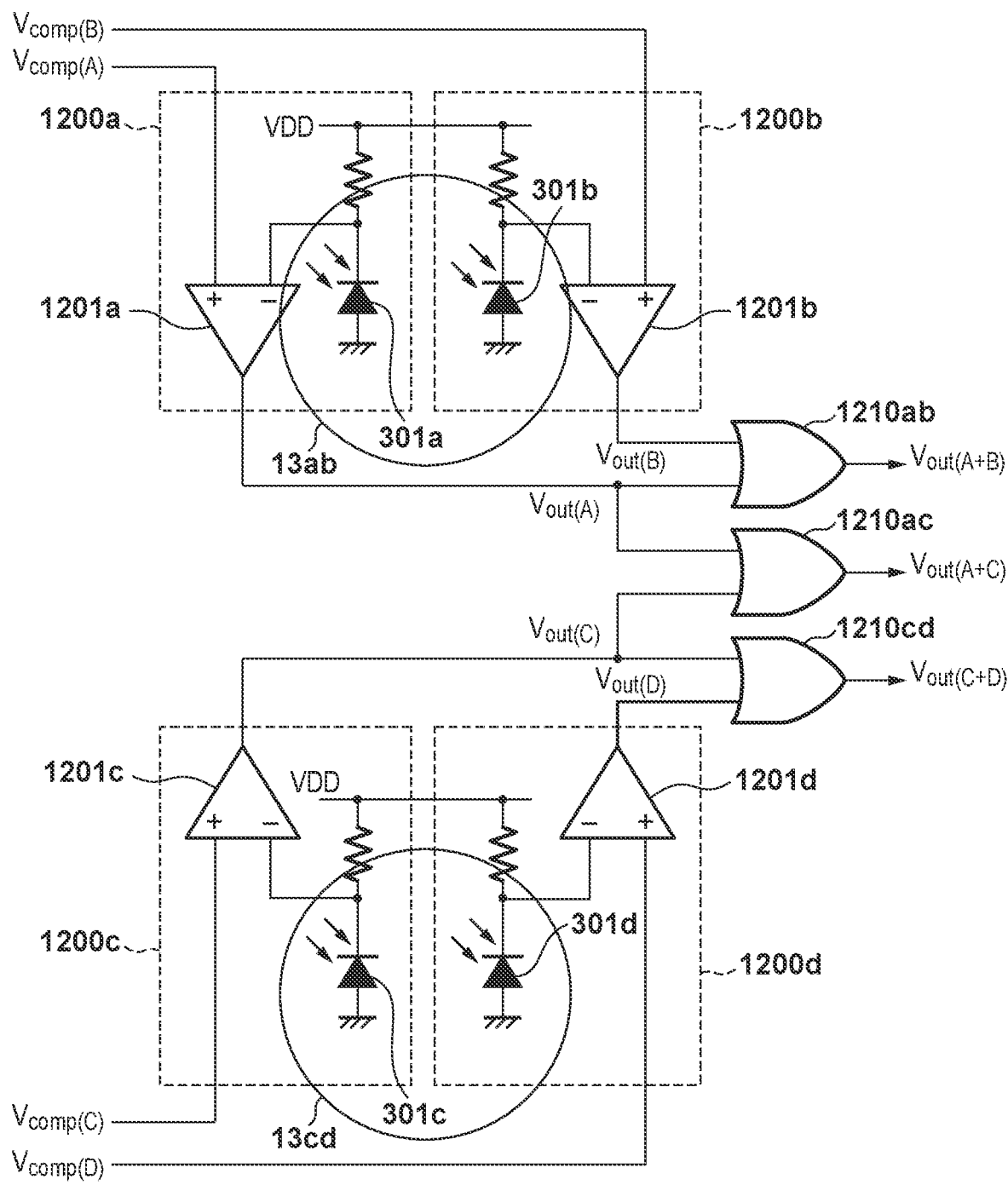
FIG. 16 is an equivalent circuit diagram illustrating a pixel according to a seventh embodiment.

FIG. 16 is an equivalent circuit diagram illustrating an example of the pixel configuration of an image sensor having a configuration in which one microlens is shared by two pixels, serving as an example of the image sensor according to the present embodiment. All of the configuration of the pixel 1200 is the same as in the fifth embodiment, a single microlens 13ab is shared by pixels 1200a and 1200b, and thus the corresponding exit pupil regions are different. Likewise, a single microlens 13cd is shared by pixels 1200c and 1200d. Once again, "pixel" as used in the present embodiment corresponds to the light-receiving circuits in the first to fourth embodiments.

The pixels 1200a and 1200c have the same corresponding exit pupil regions. Likewise, the pixels 1200b and 1200d have the same corresponding exit pupil regions. Three OR circuits 1210 are provided in accordance with the combination for adding the output signals from the four pixels. An OR circuit 1210ab outputs a logical addition signal of the output signals from the pixels 1200a and 1200b sharing the microlens 13ab. An OR circuit 1210cd outputs a logical addition signal of the output signals from the pixels 1200c and 1200d sharing the microlens 13cd. On the other hand, an OR circuit 1210ac outputs a logical addition signal of the output signals from the pixels 1200a and 1200c.

Figure 17:
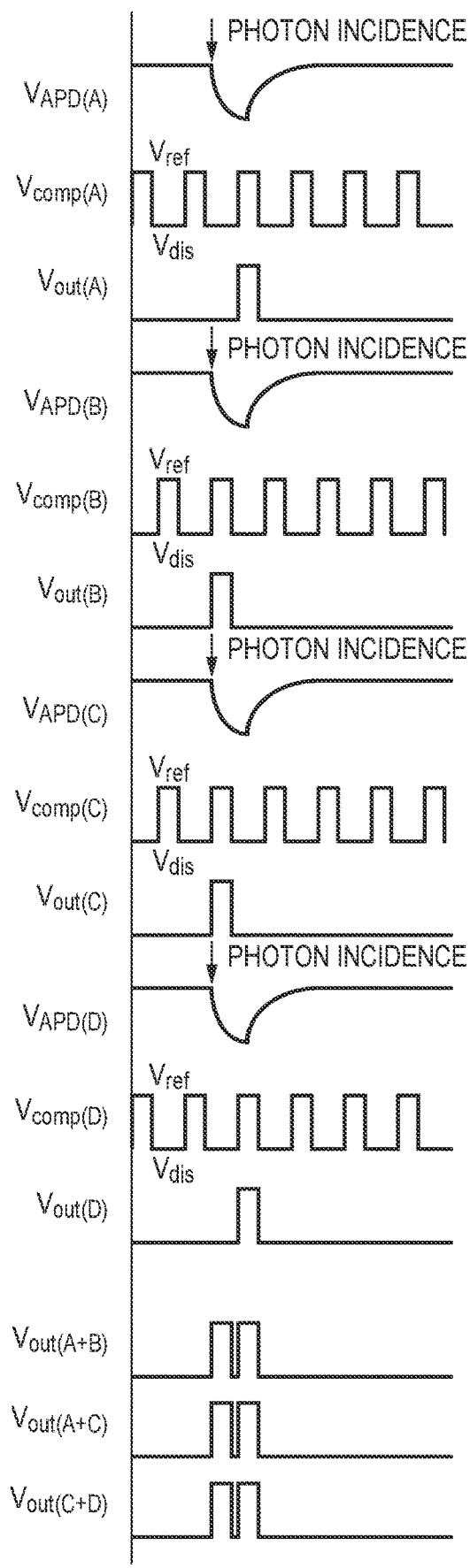
FIG. 17 is a timing chart illustrating operations of the pixel according to the seventh embodiment.

Operations of the circuit illustrated in FIG. 16 will be described next using the timing chart illustrated in FIG. 17. FIG. 17 illustrates operations when photons are incident on photodiodes 301a, 301b, 301c, and 301d at the same time.

The voltages Vcomp(A) and Vcomp(B) input to the comparison circuits 1201a and 1201b sharing the OR circuit 1210ab have their phases controlled so as not to reach the threshold voltage Vref at the same time, as described in the fifth embodiment with reference to FIG. 13. The same phase control is carried out for voltages Vcomp(C) and Vcomp(D) input to comparison circuits 1201c and 1201d sharing the OR circuit 1210cd.

A logical addition signal of the output signals output from the pixels 1200a and 1200b sharing the microlens 13ab is output, from the OR circuit 1210ab, as an image capturing signal Vout(A+B). Additionally, a logical addition signal of the output signals output from the pixels 1200c and 1200d sharing the microlens 13cd is output, from the OR circuit 1210cd, as an image capturing signal Vout(C+D).

The phases of the voltages Vcomp(A) and Vcomp(C), which are input to the comparison circuits 1201a and 1201c sharing the OR circuit 1210ac, are controlled so as not to reach the threshold voltage Vref at the same time. A logical addition signal of the output signals from the pixels 1200a and 1200c corresponding to the same partial region within the exit pupil is output from the OR circuit 1210ac as a focus detection signal Vout(A+C).

The output signals from the OR circuits 1210ab, 1210cd, and 1210ac are transferred to the corresponding signal processing circuits 1220, and are counted by a single pulse counter, without being separated. A focus detection signal Vout(B+D), which is the logical addition signal of the output signals from the pixels 1200c and 1200d, is also required for phase difference AF. In the present embodiment, the formula Vout(A+B)+Vout(C+D)−Vout(A+C)=Vout(B+D) is used to compute the focus detection signal Vout(B+D).

If no addition in the vertical direction is to be carried out, Vout(A+B), and one of Vout(A) and Vout(B), may be output from the pixels 1200*a* and 1200*b*. In this case, the other of Vout(A) and Vout(B) can be computed as the difference between a first number of pulses present in Vout(A+B) and a second number of pulses present in the one of Vout(A) and Vout(B).

When calculating a correlation for finding the amount of skew between a pair of focus detection signals, the resolution in the horizontal direction has a large amount of influence on the spatial frequency that can be detected, whereas the resolution in the vertical direction has little influence. Accordingly, in the present embodiment, in a configuration where two pixels 1200 arranged in the horizontal direction share a single microlens 13, the focus detection signal Vout(A+C) is found by adding the signals from the two pixels 1200 adjacent in the vertical direction. A noise reduction effect is achieved as a result of the addition, which is particularly useful in cases where focus detection is to be carried out accurately on a low-luminosity object. Note that the process for computing the focus detection signal Vout(B+D) can be executed by the DSP 103, for example.

In this case, the DSP 103 calculates the focus detection signal Vout(B+D) using the image capturing signals Vout (A+B) and Vout(C+D), and the focus detection signal Vout (A+C), of an output Dout from the image sensor 101. The DSP 103 then finds the amount of skew (phase difference) between the pair of focus detection signals Vout(A+C) and Vout(B+D) through correlation calculation, and communicates the result to the CPU 105. The CPU 105 converts the amount of skew into a defocus amount of the optical system 102 and drives a focusing lens provided in the optical system 102 on the basis of the defocus amount, which makes it possible to achieve phase difference-based automatic focus detection.

In this manner, the present embodiment describes a configuration in which when, in an image sensor in which a plurality of pixels (light-receiving circuits) capable of detecting single photons are arranged, a plurality of pixels share a single microlens, a plurality of pixel signals are added and output along with image signals and focus detection signals. Accordingly, the required number of counters can be made lower than the number of pixels.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-048395, filed on Mar. 15, 2018, which is hereby incorporated by reference herein in its entirety.

What is claimed is:

1. An image sensor comprising:
a plurality of pixels, each pixel including a photoelectric converter that detects incidence of single photons; and
a counter that counts pulses present in an output signal from the photoelectric converter,
wherein the image sensor outputs a count value as a pixel value, and
wherein the count value is obtained by counting the pulses present in the output signals from a plurality of the photoelectric converters in a first period, or by counting the pulses present in the output signal from a single photoelectric converter in the first period and a second period.

2. The image sensor according to claim 1,
wherein the image sensor outputs the count value as a pixel value that has been applied a filter in a spatial direction or a temporal direction.

3. The image sensor according to claim 2, further comprising:
an OR circuit that generates a logical addition signal of output signals from a plurality of the photoelectric converters,
wherein the image sensor outputs a count value, which is obtained by counting the pulses present in the logical addition signal by the counter, as a pixel value that has been applied a low-pass filter.

4. The image sensor according to claim 3, further comprising:
a frequency divider that divides at least one of the output signals, which from the plurality of photoelectric converters and input to the OR circuit,
wherein a weight applied to the at least one of the output signals is varied by varying a division ratio depending on output signal.

5. The image sensor according to claim 2,
wherein the image sensor outputs a count value, which is obtained by counting a difference between the number of pulses present in the output signals from a plurality of the photoelectric converters by the counter, as a pixel value that has been applied a high-pass filter.

6. The image sensor according to claim 1, further comprising:
a switch that switches between inputting the output signals from a plurality of photoelectric converters into the counter, and inputting the output signal from a single photoelectric converter into the counter.

7. The image sensor according to claim 6,
wherein the switch is controlled by a control signal supplied from outside the image sensor.
8. The image sensor according to claim 2,
wherein image sensor outputs a count value, which is obtained by counting a difference between the number of pulses present in the first period and the number of pulses present in the second period for the output signal from a single photoelectric converter by the counter, as a pixel value that has been applied a filter in a temporal direction.
9. The image sensor according to claim 8,
wherein the second period and the first period have the same length.
10. The image sensor according to claim 8,
wherein the counter is an up-and-down counter, and counts the difference by performing an up-count in one of the first period and the second period and a down-count in the other of the first period and the second period.
11. The image sensor according to claim 1,
wherein the image sensor has a stacked structure including a plurality of boards; and
the photoelectric converters are provided on a first board, and the counter is provided on a second board.
12. The image sensor according to claim 11,
wherein the output signals from the plurality of photoelectric converters are multiplexed at the first board and transferred to the second board.
13. The image sensor according to claim 12,
wherein, at the second board, the multiplexed output signals are demultiplexed into respective output signals for the plurality of photoelectric converters.
14. The image sensor according to claim 12,
wherein the multiplexed output signals are not demultiplexed at the second board.
15. The image sensor according to claim 12,
wherein in the case where a single microlens is shared by a first photoelectric converter and a second photoelectric converter that are adjacent in the horizontal direction, the following are transferred from the first board to the second board:
a first multiplexed signal obtained by multiplexing the output signals from the first photoelectric converter and the second photoelectric converter;
a second multiplexed signal obtained by multiplexing the output signals from a third photoelectric converter and a fourth photoelectric converter, which are adjacent to each other with respect to the horizontal direction and are adjacent to the first photoelectric converter and the second photoelectric converter with respect to the vertical direction; and
a third multiplexed signal obtained by multiplexing the output signals from the first photoelectric converter and the third photoelectric converter, or the output signals from the second photoelectric converter and the fourth photoelectric converter.

16. The image sensor according to claim 12,
wherein in the case where a single microlens is shared by a first photoelectric converter and a second photoelectric converter that are adjacent in the horizontal direction, the following are transferred from the first board to the second board:
a multiplexed signal obtained by multiplexing the output signals from the first photoelectric converter and the second photoelectric converter; and
the output signal from one of the first photoelectric converter and the second photoelectric converter.
17. The image sensor according to claim 1,
wherein the output signals from the plurality of photoelectric converters do not have pulse periods that overlap with other output signals.
18. The image sensor according to claim 17,
wherein each of the plurality of photoelectric converters generates, during a period in which a voltage change arises in the output signal due to a single photon being incident, an output signal containing a pulse in a period being different from each other.
19. The image sensor according to claim 18,
wherein the output signals from the photoelectric converters are weighted by causing the number of pulses present in the period of the output signals to vary depending on photoelectric converter.
20. The image sensor according to claim 1,
wherein each photoelectric converter comprises a photoelectric conversion element, and a comparison circuit that generates the pulse by comparing an output signal from the photoelectric conversion element with a comparison signal; and
the comparison signal is a signal in which a voltage changes in a predetermined cycle.
21. The image sensor according to claim 20,
wherein the number of pulses present in the output signal from the photoelectric converter when a single photon is incident on the photoelectric converter is set to be greater than or equal to 2 by the comparison signal.
22. An electronic device that comprises an image sensor, wherein the image sensor comprising:
a plurality of pixels, each pixel including a photoelectric converter that detects incidence of single photons; and
a counter that counts pulses present in an output signal from the photoelectric converter,
wherein the image sensor outputs a count value as a pixel value, and
wherein the count value is obtained by counting the pulses present in the output signals from a plurality of the photoelectric converters in a first period, or by counting the pulses present in the output signal from a single photoelectric converter in the first period and a second period.

* * * * *